(12) United States Patent
Kunikiyo

(10) Patent No.: US 6,545,318 B1
(45) Date of Patent: Apr. 8, 2003

(54) SEMICONDUCTOR DEVICE AND MANUFACTURING METHOD THEREOF

(75) Inventor: Tatsuya Kunikiyo, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/548,311

(22) Filed: Apr. 12, 2000

(30) Foreign Application Priority Data

Oct. 6, 1999 (JP) .......................................... 11-285269

(51) Int. Cl.$^7$ .......................... H01L 27/01; H01L 29/76
(52) U.S. Cl. ...................... 257/349; 257/347; 257/350; 257/351; 257/399
(58) Field of Search ................................. 257/347, 349, 257/350, 351, 354, 398, 399, 400

(56) References Cited

U.S. PATENT DOCUMENTS

| | | | | |
|---|---|---|---|---|
| 5,145,802 A | * | 9/1992 | Tyson et al. ................. | 438/154 |
| 5,359,219 A | * | 10/1994 | Hwang ......................... | 257/351 |
| 5,463,238 A | * | 10/1995 | Takahashi et al. .......... | 257/351 |
| 5,641,980 A | | 6/1997 | Yamaguchi et al. | |
| 5,721,444 A | * | 2/1998 | Oashi et al. ................. | 257/347 |
| 5,759,907 A | | 6/1998 | Assaderaghi et al. | |
| 5,767,549 A | * | 6/1998 | Chen et al. .................. | 257/347 |
| 5,773,152 A | * | 6/1998 | Okonogi ....................... | 428/446 |
| 6,072,217 A | * | 6/2000 | Burr ............................. | 257/351 |
| 6,121,659 A | * | 9/2000 | Christensen et al. ........ | 257/347 |
| 6,133,608 A | * | 10/2000 | Flaker et al. ................ | 257/347 |
| 6,215,155 B1 | * | 4/2001 | Wollesen ...................... | 257/351 |

FOREIGN PATENT DOCUMENTS

| | | |
|---|---|---|
| JP | 58-124243 | 7/1983 |
| JP | 9-223802 | 8/1997 |

OTHER PUBLICATIONS

"Highly Reliable Double Well in Thin–p$^{13}$ on p$^+$Epitaxial Wafer for Logic–Embedded DRAM", T. Yamashita et al., IEDM97, pp. 673–676.
"SOI MOSFET MisMatch Due to Floating–Body Effects", J. A. Mandelman et al., Proceedings 1997 IEEE International SOI Conference, Oct. 1997, pp. 164–165.
"A New SOI Structure for Mixed Mode IC's and Its Body–Related Characteristics", H. Lee et al., Proceedings 1998 IEEE International SOI Conference, Oct. 1998, pp. 63–64.

* cited by examiner

*Primary Examiner*—Matthew Smith
*Assistant Examiner*—Lex H. Malsawma
(74) *Attorney, Agent, or Firm*—McDermott, Will & Emery

(57) ABSTRACT

An impurity layer is formed between a semiconductor substrate and a buried oxide film in an SOI substrate composed of the semiconductor substrate, the buried oxide film and a semiconductor layer.

8 Claims, 19 Drawing Sheets

SEMICONDUCTOR DEVICE AND MANUFACTURING METHOD THEREOF

BACKGROUND OF THE INVENTION

1. Field of the Invention

The present invention relates to a semiconductor device having an SOI (Silicon On Insulator) structure and a manufacturing method thereof, and particularly to a semiconductor device having an isolation insulating film with its bottom surface not reaching a buried oxide film (hereinafter, referred to as a "partial STI (Shallow Trench Isolation)"), and a manufacturing method thereof.

2. Description of the Background Art

A semiconductor device having an SOI structure including a semiconductor substrate, a buried oxide film, and a semiconductor layer is configured such that active regions are surrounded by the buried oxide film and an element isolation with its bottom surface reaching the buried oxide film (hereinafter, referred to as a "full STI (Shallow Trench Isolation)"). Such a semiconductor device has advantages that even if CMOS transistors are formed, there is no fear of occurrence of latchup; since the source/drain regions are in contact with the buried oxide film, a junction capacitance is smaller than that of a semiconductor device in which transistors are directly formed on the surface of a semiconductor substrate, to enable high-speed operation; and since the leakage current upon stand-by becomes smaller, the power consumption can be suppressed.

According to the above semiconductor device, however, if the thickness of the semiconductor layer formed on the surface of the buried oxide film is as larger as 0.15 μm or more, carriers generated by impact ionization phenomenon (holes for an nMOS, and electrons for a pMOS) are accumulated in a portion, under a channel formation region, of the semiconductor layer, so that kink occurs, the operational breakdown voltage is degraded, or the potential of the channel region is made unstable, thereby causing various problems due to the substrate floating effect, such as the dependence of delay time on frequency. As a result, in general, the potential of each channel formation region is fixed. Japanese Patent Laid-open No. Sho 58-124243 discloses a semiconductor device in which the potential of each channel formation region is fixed as described above.

In recent years, a structure has been known, for example, from IEEE International SOI Conference, October 1997, in which isolation by the partial STI is performed not to fix potentials of channel formation regions for each transistor but to collectively fix potentials of channel formation regions of a plurality of transistors having the same conduction type, thereby realizing the micro-structure of the semiconductor device.

FIG. 26 is a top view of a conventional semiconductor device. In the figure, reference numeral 104 designates an isolation insulating film; 106 is a gate electrode; 107 and 108 are source/drain regions, and 109 is a wiring line. As shown in the figure, in the case of adopting the partial STI, the wiring line 109 for fixing the potential of channel formation regions is formed so as to accord with a plurality of transistors having the same conduction type.

FIG. 27 is a sectional view, taken on line X—X of FIG. 26, of the conventional semiconductor device. In the figure, reference numeral 101 designates a semiconductor substrate; 102 is a buried oxide film; 1010 is a channel formation region; 105 is a gate insulating film; 103 is a semiconductor layer; and 1011 is a channel stopper layer. As shown in the figure, the isolation insulating film 104 between two adjacent transistors does not reach the buried oxide film 102, and the channel stopper layer 1011 heavily containing an impurity having the same conduction type as that of the channel formation region 1010 is formed under the isolation insulating film 104. The two channel formation regions 1010 are connected to each other via the channel stopper layer 1011, and are connected to the wiring line 109. In this way, the potentials of the channel formation regions 1010 are fixed.

The partial STI structure, however, is low in between-element isolation breakdown voltage. As a result, if a differential potential occurs between source/drain regions adjacent to each other via the channel stopper layer by, for example, applying a source voltage to one of wiring lines (not shown) connected to the source/drain regions of the adjacent transistors and applying a drain voltage to the other, a relatively large leakage current may flow in the channel stopper layer. To solve such an inconvenience, the between-element isolation width must be set at a large value, thereby obstructing formation of a micro-structure of the semiconductor device.

FIG. 28 is a sectional view, taken on line Y—Y of FIG. 26, of the conventional semiconductor device. As is apparent from the figure, since the isolation insulating film 104 between the source/drain regions of the adjacent transistors does not reach the buried oxide film 102, a leakage current may flow between the source/drain regions via the channel stopper layer 1011.

SUMMARY OF THE INVENTION

An object of the present invention is to provide a semiconductor device including an isolation insulating film having a partial STI structure capable of collectively fixing voltages applied to channel formation regions of a plurality of transistors, characterized by suppressing a leakage current flowing through a channel stopper layer provided under the isolation insulating film, thereby improving the isolation characteristic and breakdown voltage, and to provide a method of manufacturing the semiconductor device.

The above objects of the present invention are achieved by a semiconductor device including an SOI substrate composed of a semiconductor substrate, a buried oxide film, and a semiconductor layer. The semiconductor device includes an isolation insulating film formed in such a manner as to surround first and second active regions arranged on a principal surface of said semiconductor layer and to be separated a specific distance from said buried oxide film. The device also includes a first active element formed in said first active region as well as a second active element formed in said second active region. An impurity layer is formed between said buried oxide film and one principal plane of said semiconductor substrate. Further, a wiring line is electrically connected to said impurity layer.

The above objects of the present invention are achieved by a method of manufacturing a semiconductor device. In the method, an impurity layer is formed on the surface of a semiconductor substrate of an SOI substrate having a semiconductor layer formed on the surface of said semiconductor layer via a buried oxide film. An isolation insulating film is formed in such a manner as that said isolation insulating film surrounds first and second active regions arranged on the surface of said buried oxide film and a portion of said semiconductor layer remains under said isolation insulating film. A first active element is formed in said first active region. A second active element is formed in said second active region. Further, a wiring line connected to said impurity layer is formed.

The above objects of the present invention are also achieved by a method of manufacturing a semiconductor device. In the method, a mask is formed for covering the surfaces of first and second active regions arranged on a buried oxide film of an SOI substrate having a semiconductor layer formed on the surface of a semiconductor substrate via said buried oxide film. The semiconductor layer is etched downwardly from a principal surface thereof by using said mask in such a manner that a bottom portion of said semiconductor layer remains, to form a trench surrounding said first and second active regions. Ions of an impurity are implanted in a portion, under said trench, of said semiconductor substrate, to form an impurity layer on the surface of said semiconductor substrate. An insulating film is formed over the entire surface. A portion, on the surface of said mask, of said insulating film is removed before the mask is removed. A first active element is formed in said first active region. A second active element is formed in said second active region. Further, a wiring line connected to said impurity layer is formed.

Other objects and further features of the present invention will be apparent from the following detailed description when read in conjunction with the accompanying drawings.

DESCRIPTION OF THE PREFERRED EMBODIMENTS

First Embodiment

Figure 1:
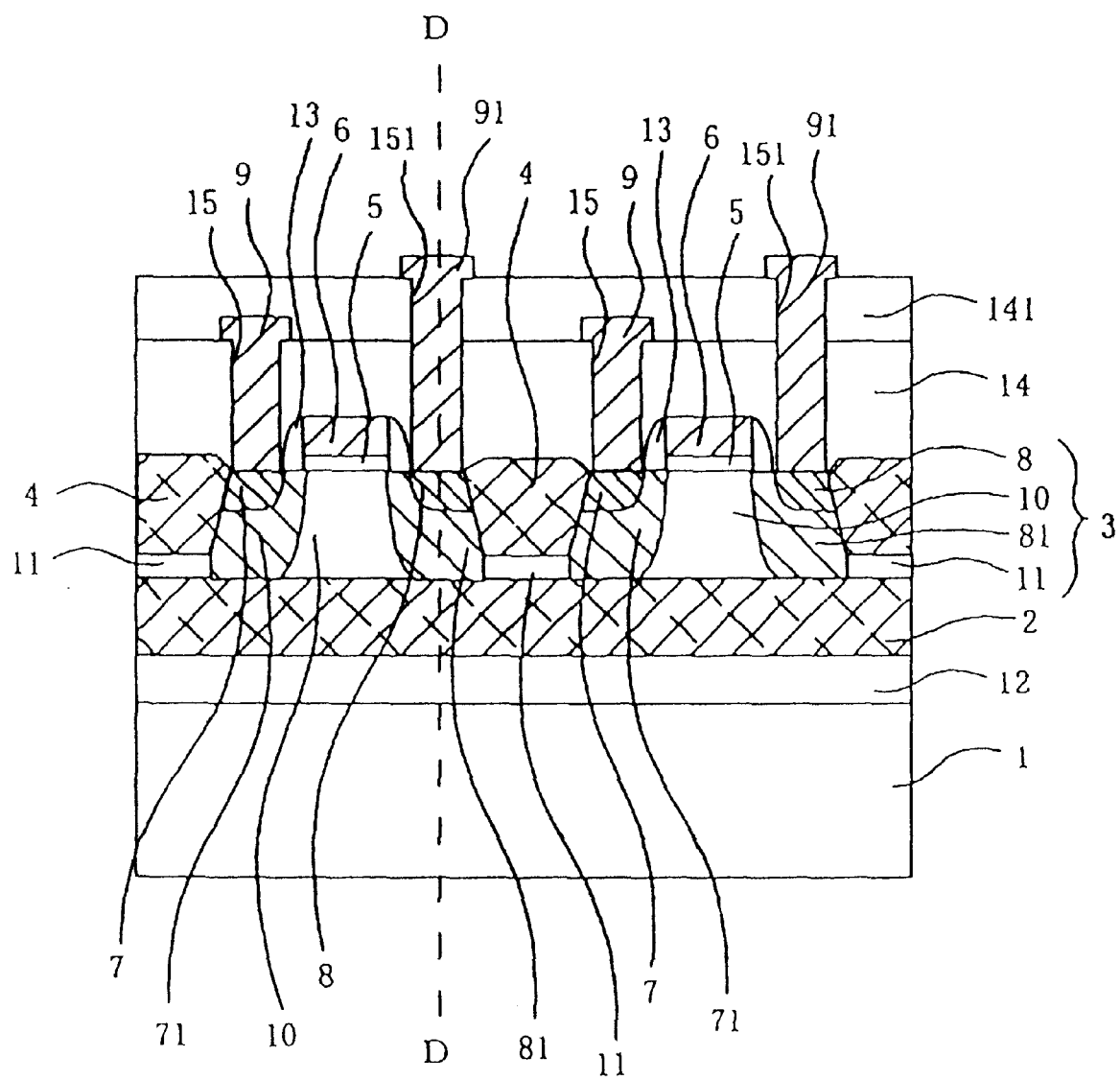
FIG. 1 is a sectional view, taken on line A—A of FIG. 2, showing a semiconductor device according to a first embodiment of the present invention.

FIG. 1 is a sectional view of a semiconductor device according to a first embodiment of the present invention, in which reference numeral 1 designates a p-type semiconductor substrate; 2 is a buried oxide film; 3 is a semiconductor layer; 4 is an isolation insulating film; 5 is a gate insulating film; 6 is a gate electrode; 7 and 8, and 71 and 81 are source/drain regions; 9 and 91 are wiring lines; 10 is a channel formation region; 11 is a channel stopper layer; 12 is an impurity layer; 13 is a side wall; 14 and 141 are interlayer insulating films; and 15 and 151 are contact holes. The source/drain regions 7, 8, 71 and 81, and the channel stopper layer 11 are formed by implanting impurities in the semiconductor layer 3.

The structure including the semiconductor substrate 1, the buried oxide film 2 and the semiconductor layer 3 is called an SOI substrate. The SOI substrate may be formed by any method such as a lamination method or an SIMOX method.

With the thickness of the semiconductor layer 3 in a range of about 30 to 200 nm and the thickness of the buried oxide film 2 in a range of about 0.04 to 0.4 $\mu$m, the channel stopper layer 11 contains a p-type impurity such as boron at a concentration of about $1\times10^{17}$ to $1\times10^{18}/cm^3$, the impurity layer 12 contains a p-type impurity such as boron at a concentration of about $1\times10^{17}$ to $1\times10^{19}/cm^3$ and the channel formation region 10 contains a p-type impurity such as boron in at a concentration of about $1\times10^{17}$ to $1\times10^{18}/cm^3$. The concentration of the impurity in the channel stopper layer 11 may be the same as that of the impurity in the channel formation region 10; however, the isolation characteristic of the channel stopper layer 11 becomes higher with an increase in concentration of the impurity in the channel stopper layer 11.

The source/drain regions 7 and 8 contain an n-type impurity such as arsenic at a concentration of about $1\times10^{19}$ to $1\times10^{21}/cm^3$, and the source/drain regions 71 and 81 contain an n-type impurity such as phosphorous or arsenic at a concentration of about $1\times10^{17}$ to $1\times10^{20}/cm^3$ and extend up to the buried oxide film 2, to form a LDD (Lightly Doped Drain) structure.

The gate electrode 6 is made from polysilicon containing an n-type impurity such as phosphorous at a concentration of about $2\times10^{20}$ to $15\times10^{20}/cm^3$ in the first embodiment;

however, it may be made from a stacked structure having polysilicon doped with an impurity and a metal silicide layer such as $WSi_x$, or may be made from a metal such as W, Mo, Cu or Al.

While not shown, cobalt silicide may be formed on the surfaces of the gate electrode 6 and the source/drain regions 7 and 8.

Active regions in each of which one or a plurality of transistors are formed are surrounded by a partial isolation region composed of the channel stopper layer 11 formed on the buried oxide film 2 and the isolation insulating film 4 such as a silicon oxide film formed on the channel stopper layer 11, to be thus isolated from each other. The isolation width is in a range of about 200 to 500 nm. The thickness of the isolation insulating film 4 is set such that the thickness of the channel stopper layer 11 under the isolation insulating film 4 is in a range of 10 to 100 nm. From the viewpoint of micro-structure formation processing, it may be desirable that the upper surface of the isolation insulating film 4 be at the same level as that of the semiconductor layer 3; however, in the case where the semiconductor layer 3 is thin, if it is intended to sufficiently ensure the thickness of the channel stopper layer 11, it becomes difficult to ensure the necessary thickness of the isolation insulating film 4. For this reason, to improve the element isolation characteristic, it may be desirable to make the upper surface of the isolation insulating film 4 higher than the surface of the semiconductor layer 3. While not shown, a silicon oxide film having a thickness of about 5 to 30 nm is formed between the semiconductor layer 3 and the isolation insulating film 4 as needed. The isolation insulating film, which is configured as the silicon oxide film in this embodiment, may be configured as a silicon nitride film, a silicon oxynitride film, or a silicon oxide-fluoride (SiOF) film.

The gate insulating film 5 is made from a material such as $SiO_2$, SiON, $SiO_2/Si_3N_4/SiO_2$ (ONO structure), or $Ta_2O_5$, $Al_2O_3$.

Figure 2:
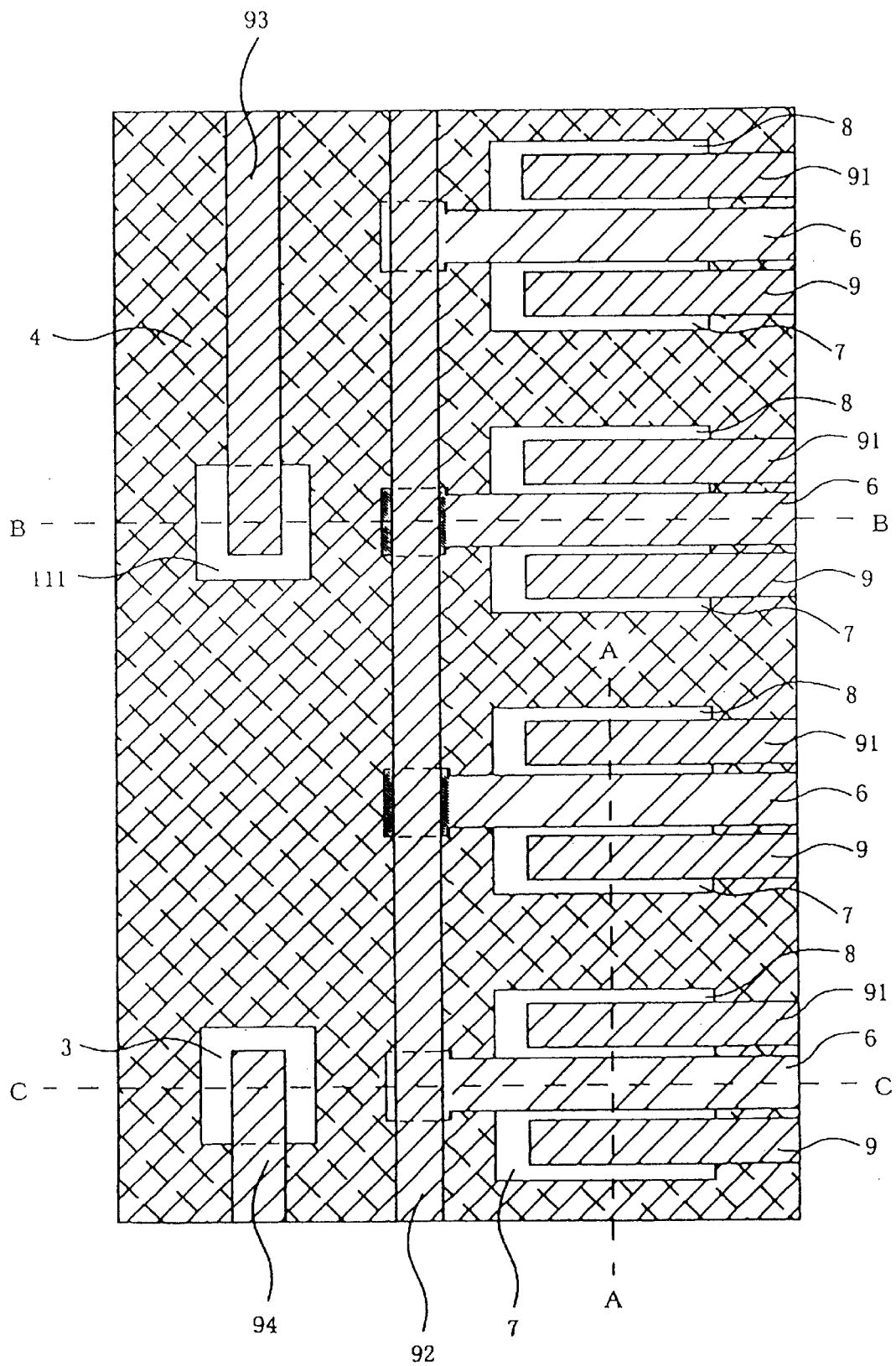
FIG. 2 is a top view of the semiconductor device according to the first embodiment.

FIG. 2 is a top view of the semiconductor device according to the first embodiment. FIG. 1 is a sectional view taken on line A—A of FIG. 2. In FIG. 2, reference numeral 92, 93 and 94 designate wiring lines, and 111 is an impurity region. The wiring line 92 is electrically connected to the gate electrode 6 for applying a gate voltage to the gate electrode 6, and the wiring line 93 is electrically connected to the impurity region 111.

Figure 3:
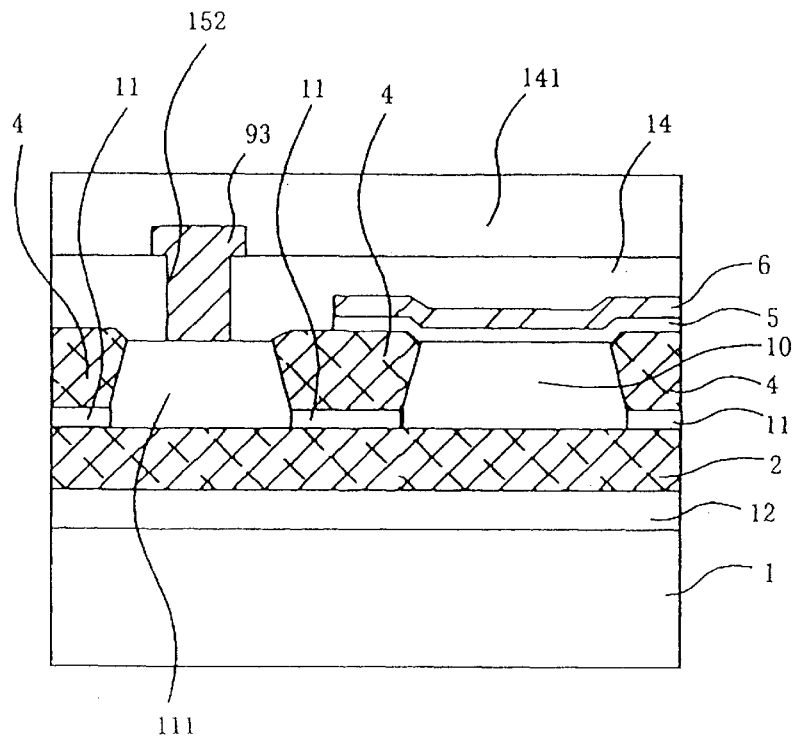
FIG. 3 is a sectional view, taken on line B—B of FIG. 2, of the semiconductor device according to the first embodiment.

FIG. 3 is a sectional view, taken on line B—B of FIG. 2, of the semiconductor device according to the first embodiment, in which reference numeral 152 designates a contact hole. Referring to FIG. 3, a voltage is applied to the impurity region 111 through the wiring line 93, so that the potential of the channel formation region 10 connected to the impurity region 111 via the channel stopper layer 11 is fixed. The impurity region 111 contains an impurity having the same conduction type as that of the impurity contained in the channel formation region 10. The concentration of the impurity in the impurity region 111 may be nearly similar to that of the impurity in the channel formation region 10. However, the resistance of the impurity region 111 can be made small by setting the concentration of the impurity in the impurity region 111 higher than that of the impurity in the channel formation region 10.

Figure 4:
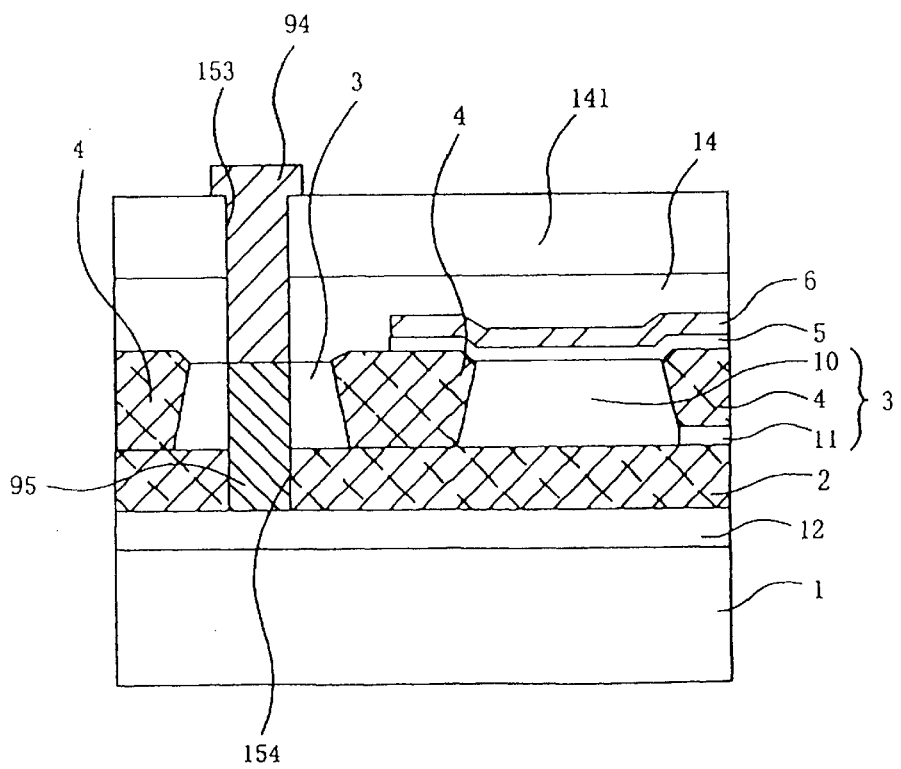
FIG. 4 is a sectional view, taken on line C—C of FIG. 2, of the semiconductor device according to the first embodiment.

FIG. 4 is a sectional view, taken on line C—C of FIG. 2, of the semiconductor device according to the first embodiment, in which reference numeral 95 designates a wiring line, and 153 and 154 are contact holes. Referring to FIG. 4, the wiring line 94 is buried in the contact hole 153 formed in the interlayer insulating films 14 and 141. The wiring line 94 is connected to the impurity layer 12 via the wiring line 95 buried in the contact hole 154 formed in the semiconductor layer 3 and the buried oxide film 2, to fix the potential of the impurity layer 12. Since the impurity layer 12 and the channel formation region 10 are independently controlled, the isolation insulating film 4 surrounding the semiconductor layer 3 in which the contact hole 154 for forming the wiring line 95 is formed acts as the full STI which perfectly isolates the above semiconductor layer 3 from the semiconductor layer 3 in which the element is formed.

Figure 5:
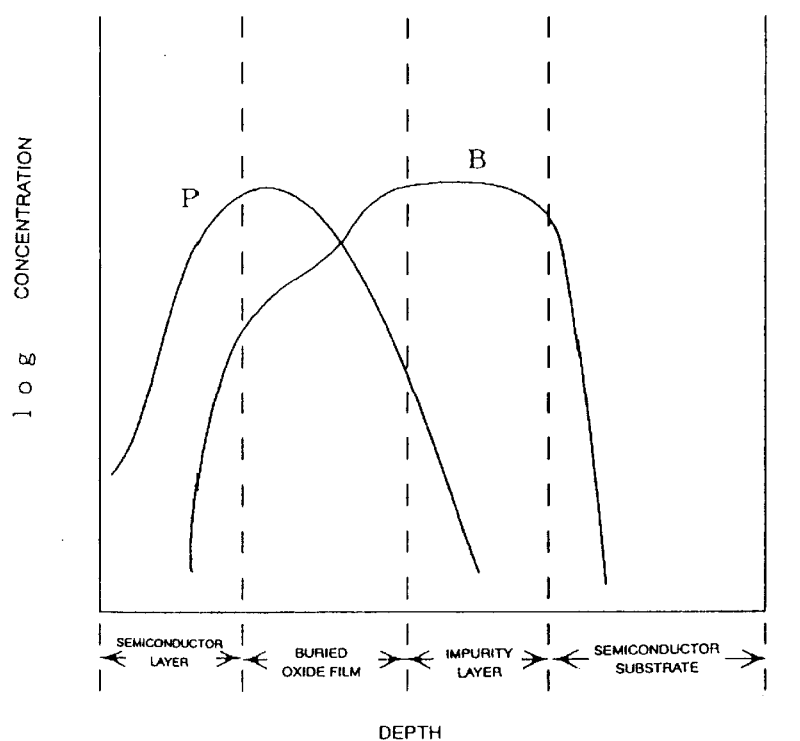
FIG. 5 is a graph showing concentration distributions of impurities contained in the semiconductor device according to the first embodiment.

FIG. 5 is a graph showing concentration distributions, along the D—D cross section of FIG. 1, of the impurities contained in the semiconductor layer 3, the buried oxide film 2, and the semiconductor substrate 1 of the semiconductor device according to the first embodiment. Since boron implanted for forming the impurity layer 12 diffuses toward the surface by heat-treatments performed at various steps, the concentration of boron is distributed as shown in FIG. 5.

The operation of the semiconductor device according to the first embodiment will be described. Referring to FIG. 1, for an nMOS transistor, voltages described below are applied to the respective electrodes: $V_G$=about 0 to 1.8 V, $V_D$=about 0 to 1.8 V, $V_S$=about 0 V, and $V_B$=about 0 to −1 V. A channel is formed on the surface of the channel formation region 10 under the gate electrode 5, and either the source/drain regions 7 and 71 or the source/drain regions 8 and 81 are taken as source regions and the others are taken as the drain regions, to act as a circuit. At this time, 0 V is applied to the channel formation region 10, and 1 or −1 V is applied to the impurity layer 12. These voltages are for illustrative purposes only, and actually, the voltages are varied depending on the thickness of the gate insulating film and the gate length. Further, the absolute value of the voltage applied to the impurity layer 12 becomes larger or smaller with an increase or a decrease in thickness of the buried oxide film 2.

Figure 6:
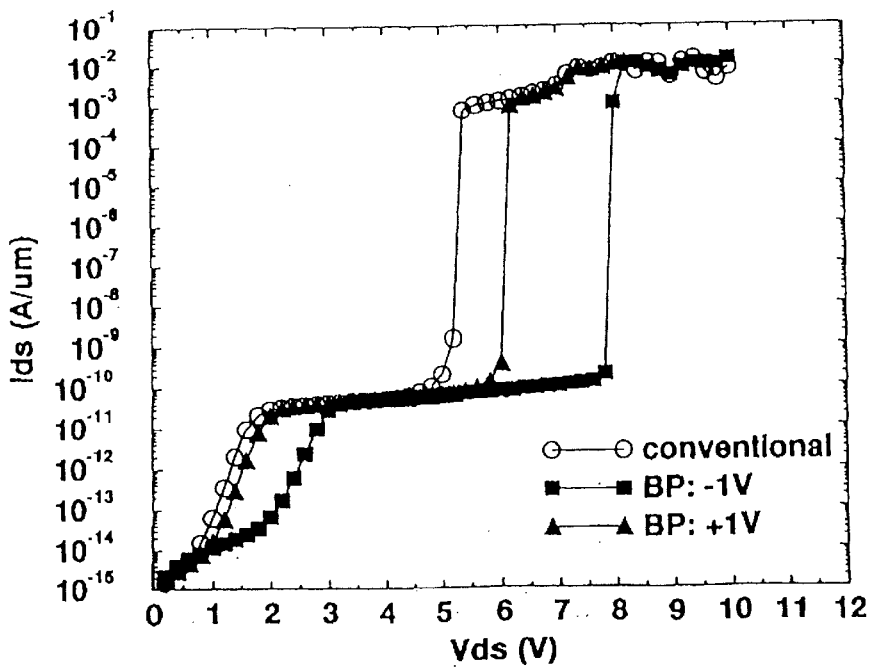
FIGS. 6 and 7 are graphs showing leakage currents of the semiconductor device according to the first embodiment.

FIG. 6 is a graph showing leakage currents of the semiconductor device according to the first embodiment shown in FIG. 1, obtained by simulation with the thickness of the semiconductor layer 3 set at 0.15 µm, the thickness of the buried oxide film 2 set at 40 nm, and the width of the isolation insulating film 4 set at 0.2 µm. In the graph, the abscissa designates a differential potential occurring between the source/drain regions 7, 71 and 8, 81 of the transistors adjacent to each other via the isolation insulating film 4, and the ordinate designates a leakage current occurring therebetween. In the figure, a curve (○) shows the data obtained in the case where the impurity layer 12 is not formed; a curve (■) shows the data obtained in the case where −1 V is applied to the impurity layer 12; and a curve (▲) shows the data in the case where 1 V is applied to the impurity layer 12. As is apparent from the graph, the formation of the impurity layer 12 is effective to reduce the leakage current and to improve the breakdown voltage.

In this embodiment, the impurity layer 12 is formed over the entire surface; however, an improved isolation characteristic can be ensured by forming the impurity layer 12 only under a portion at which the partial STI is used for element isolation.

The portion at which the nMOS transistors are adjacent to each other is illustrated in this embodiment; however, the same is true for a portion at which pMOS transistors are adjacent to each other. To be more specific, the present invention can be applied to a portion at which the source/drain regions 7, 71 and 8, 81 having the same conduction type are adjacent to each other via the partial STI and a differential potential occurs therebetween by the circuit configuration. For the pMOS transistors, the conduction type of each impurity region is reversed to that for the nMOS transistors excluding the semiconductor substrate 1; the applied voltages are set at $V_G$=about 0 to 1.8 V, $V_D$=about 0 to 1.8 V, $V_S$=about 1.8 V, and $V_B$=about 1.8 V; and 1.8 V is applied to the channel formation regions 10, and ±1 V is applied to the impurity layer 12. In addition, an n-type impurity may be contained in polysilicon of the gate electrode 6.

While the arrangement of the wiring lines 9 and 91 to 94 is illustrated in this embodiment, the number and arrangement of interlayer insulating films formed between the semiconductor substrate and the transistor differs depending on the circuit configuration. Further, while the semiconductor device in which one transistor is formed in one active region is illustrated in this embodiment, the present invention is not limited thereto and may be applied to a semiconductor device in which a plurality of transistors are formed in one active region.

According to this semiconductor device, the isolation insulating film 4 having the partial STI structure is formed on the buried oxide film for isolating a plurality of transistors having the same conduction type, and the impurity layer 12 having the conduction type reversed to that of the transistors is formed on the surface of the semiconductor substrate at a position under the isolation insulating film 4 so as to fix the potential of the position. Accordingly, even if a differential potential occurs between source/drain regions adjacent to each other via the isolation insulating film 4, it is possible to suppress occurrence of a leakage current generated therebetween and also to enhance the breakdown voltage. As a result, it is possible to realize a semiconductor device having a micro-structure, capable of improving the isolation characteristic in spite of the micro-structure.

In the case where the impurity layer 12 is formed in such a manner as to extend not only under the isolation insulating film 4 but also under the source/drain regions 71 and 81, even if the impurity implanted for forming the source/drain regions passes through the buried oxide film 2 until reaching the semiconductor substrate 1, it is entrapped by the impurity layer formed on the surface of a semiconductor substrate. As a result, since the potential of the impurity layer 12 is fixed, there is no fear of malfunction of the circuit, whereby the reliability of the semiconductor device is improved.

There required a high sensitivity for a transistor used as a sense amplifier (crosslinking or cross-coupled amplifier), etc. Thus, threshold voltages of such kind of transistors are accurately set when channel formation regions thereof have floating structure and adjacent ones of those transistors share the same floating channel formation region. In this case, in order for the transistors to be shaped not to be affected by other transistors, only the isolation between the transistors to be shared is performed by the partial STI, and the isolation for the other transistors is performed by full STI. The cross-section section of the portion at which the channel formation regions are floated is the same as that shown in FIG. 1.

Figure 7:
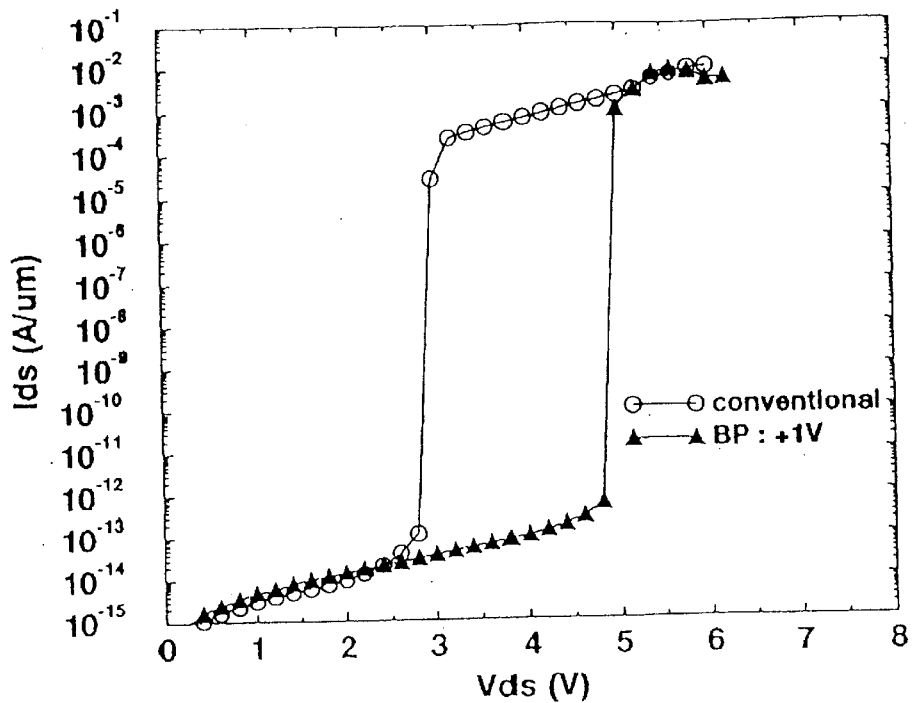

FIG. 7 is a graph showing leakage currents of the semiconductor device according to the first embodiment shown in FIG. 1, obtained by simulation under a condition in which the thickness of the semiconductor layer 3 is set at 0.15 $\mu$m, the thickness of the buried oxide film 2 is set at 40 nm, and the width of the isolation insulating film 4 is set at 0.2 $\mu$m; and no voltage is applied to the channel formation region 10, that is, the body is in the floating state. In the graph, the abscissa designates a differential potential occurring between the source/drain regions 7, 71 and 8, 81 of the transistors adjacent to each other via the isolation insulating film 4, and the ordinate designates a leakage current occurring therebetween. In the figure, a curve (○) shows the data obtained in the case where the impurity layer 12 is not formed, and a curve (▲) shows the data in the case where 1 V is applied to the impurity layer 12. As is apparent from the graph, the breakdown voltage is improved by forming the impurity layer 12 and applying 1 V to the impurity layer 12.

In this embodiment, the sense amplifier is taken as an example of floating the channel formation regions; however, even for the transistor used as the sense amplifier, the potential of the channel formation region may be of course fixed.

In the above description, the portion at which the nMOS transistors are adjacent to each other is illustrated; however, the same is true for a portion at which pMOS transistors are adjacent to each other. To be more specific, the present invention can be applied to a portion at which the source/drain regions 7, 71 and 8, 81 having the same conduction type are adjacent to each other via the partial STI and a differential potential occurs therebetween by the circuit configuration. For the pMOS transistors, the conduction type of each impurity region is reversed to that for the nMOS transistors; the applied voltages are set at $V_G$=about 0 to 1.8 V, $V_D$=about 0 to 1.8 V, $V_S$=about 1.8 V, and $V_B$=about 1.8 V; and −1 V is applied to the impurity layer 12. In addition, a voltage may be or may be not applied to the wiring line 93 and the impurity region 111.

In the semiconductor device in which the voltages are applied as described above, there is provided on the buried oxide film the isolation insulating film having the partial STI structure for isolating a plurality of transistors having the same conduction type. When the channel formation regions of the transistors adjacent to each other via the isolation insulating film are floated to be shared with each other, it becomes possible to accurately make even the threshold voltages thereof. Further, on the surface of the semiconductor substrate at a position under the isolation insulating film is the impurity layer having the conduction type reversed to that of the transistors so as to fix the potential of the position. Accordingly, even if a differential potential occurs between source/drain regions adjacent to each other via the isolation insulating film, it is possible to suppress occurrence of a leakage current generated therebetween and also to enhance the breakdown voltage. As a result, there can be provided a semiconductor device having improved isolation characteristics while being miniaturized.

A method of manufacturing the semiconductor device according to the first embodiment will be described below.

Figure 8:
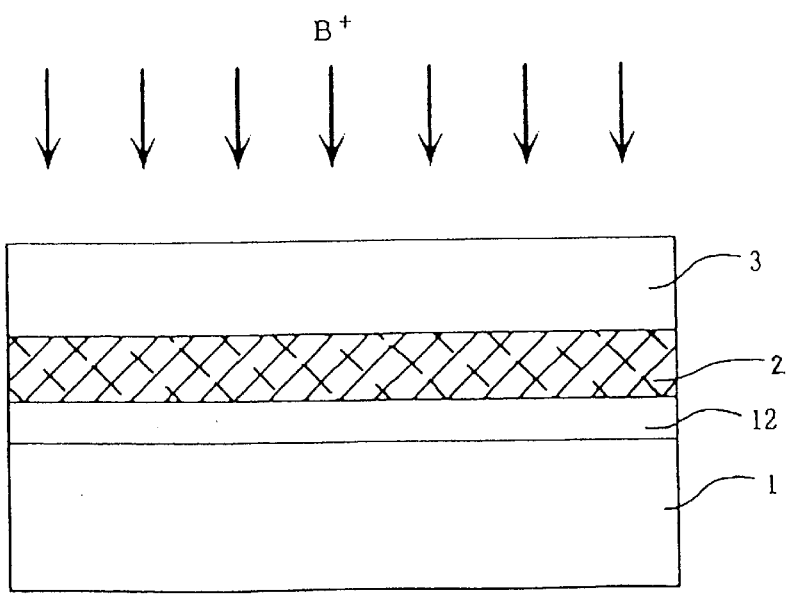
FIGS. 8 to 10 and 13 are sectional views of fragmentary structures of the semiconductor device according to the first embodiment, showing sequential steps of manufacturing the semiconductor device.

FIGS. 8 to 10, and 13 are sectional views of fragmentary structures of the semiconductor device according to the first embodiment, showing sequential steps of manufacturing the semiconductor device. Referring to FIG. 8, ions of a p-type impurity such as boron for an nMOS or ions of an n-type impurity such as phosphorus for a pMOS are implanted in the surface of an SOI substrate including a buried oxide film 2 and a semiconductor layer 3 on the surface of a semiconductor substrate 1, to form an impurity layer 12 between the semiconductor substrate 1 and the buried oxide film 2. The cross-section of FIG. 8 shows the fragmentary structure of the semiconductor device at the stage after completion of the above step. The implantation condition differs depending on the thickness of the buried oxide film 2. The p-type impurity such as boron is implanted at an energy of about 200 to 300 keV and a dose of about $1 \times 10^{13}$ to $\times 10^{14}$/cm² when the thickness of the buried oxide film is about 0.04 µm, and is implanted at an energy of about 500 to 600 keV and a dose of about $1\times10^{13}$ to $1\times10^{14}/cm^2$ when the thickness of the buried oxide film is about 0.4 µm. The n-type impurity such as phosphorus is implanted at an energy of about 200 to 300 keV and a dose of about $1\times10^{12}$ to $1\times10^{14}/cm^2$ when the thickness of the buried oxide film is about 0.04 µm, and is implanted at an energy of about 500 to 600 keV and a dose of about $1\times10^{12}$ to $1\times10^{14}/cm^2$ when the thickness of the buried oxide film is about 0.4 µm. The formation method of the impurity layer 12 is not limited to the ion implantation method but may be a plasma doping method or a cluster ion beam method.

Figure 9:
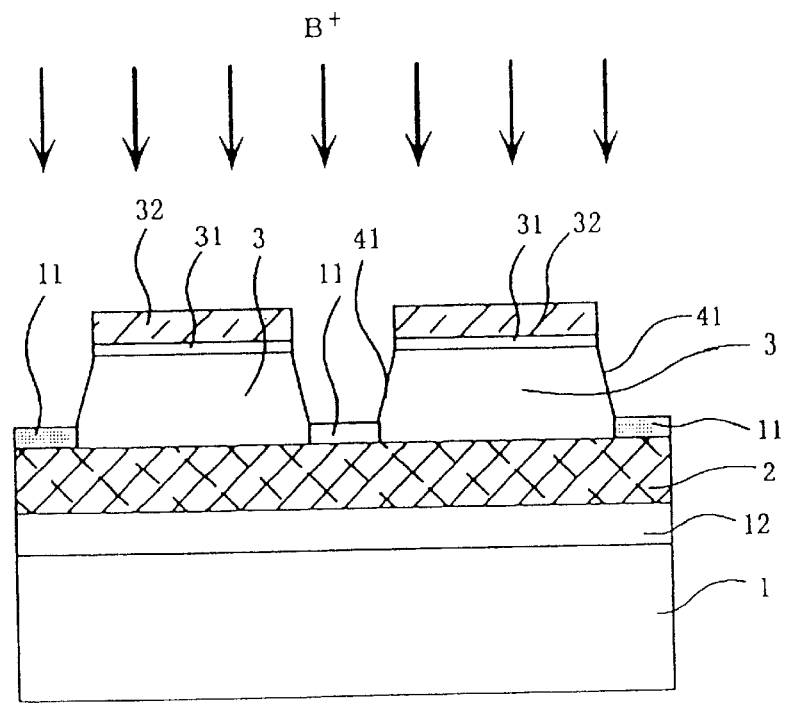

In FIG. 9, reference numeral 31 designates a silicon oxide film, 32 is a silicon nitride film, and 41 is a trench. Referring to FIG. 9, a silicon oxide film 31 having a thickness of about 5 to 30 nm and a silicon nitride film 32 having a thickness of about 100 to 300 nm are formed on the surface of the semiconductor layer 3. Portions of the silicon nitride film 32 and the silicon oxide film 31 positioned on an isolation region are selectively removed by anisotropic etching by using a photoresist mask (not shown). After removal of the photoresist mask, the semiconductor layer 3 is selectively removed by anisotropic etching by using the silicon nitride film 32 as a mask, to form a trench 41 having a depth of about 100 to 500 nm on the surface of the buried oxide film 2. Then, ions of a p-type impurity such as boron for the nMOS, or ions of an n-type impurity such as phosphorus or arsenic for the pMOS are implanted over the entire surface at an energy of about 10 to 20 keV and a dose of about $5\times10^{12}$ to $1\times10^{13}/cm^2$, to form a channel stopper layer 11. The cross-section of FIG. 9 shows the fragmentary structure of the semiconductor device at the stage after completion of the above step.

In the case of forming the impurity layer 12 only in the isolation region, like the formation of the channel stopper layer 11, the impurity layer 12 may be formed after formation of the trench 41. The implantation condition for partial formation of the impurity layer 12 differs depending on the thickness of the buried oxide film 2. The p-type impurity such as boron is implanted at an energy of about 150 to 200 keV and a dose of about $1\times10^{13}$ to $1\times10^{14}/cm^2$ when the thickness of the buried oxide film is about 0.04 µm, and is implanted at an energy of about 450 to 550 keV and a dose of about $1\times10^{13}$ to $1\times10^{14}/cm^2$ when the thickness of the buried oxide film is about 0.4 µm. The n-type impurity such as phosphorus is implanted at an energy of about 150 to 250 keV and a dose of about $1\times10^{12}$ to $1\times10^{14}/cm^2$ when the thickness of the buried oxide film is about 0.04 µm, and is implanted at an energy of about 450 to 550 keV and a dose of about $1\times10^{13}$ to $1\times10^{14}/cm^2$ when the thickness of the buried oxide film is about 0.4 µm.

Figure 10:
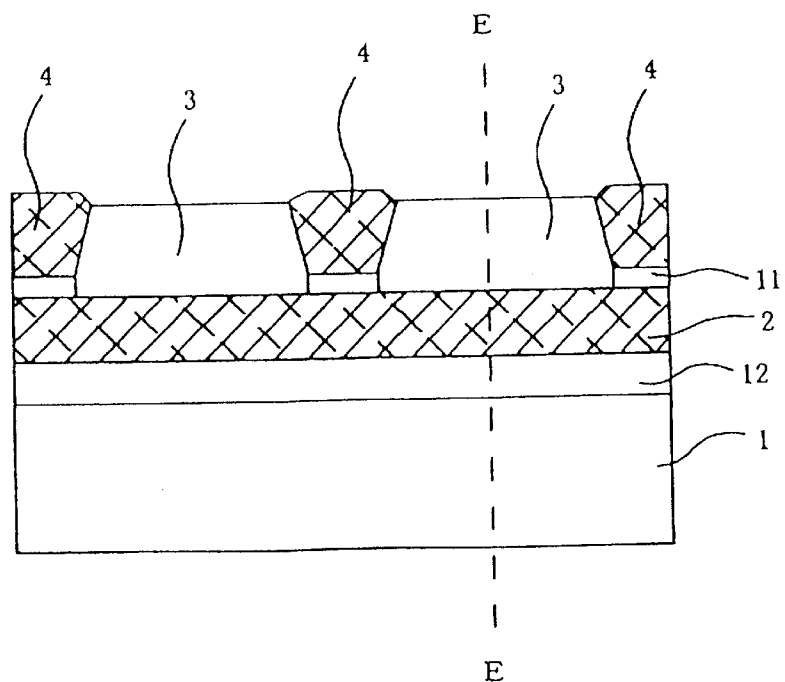
Figure 11:
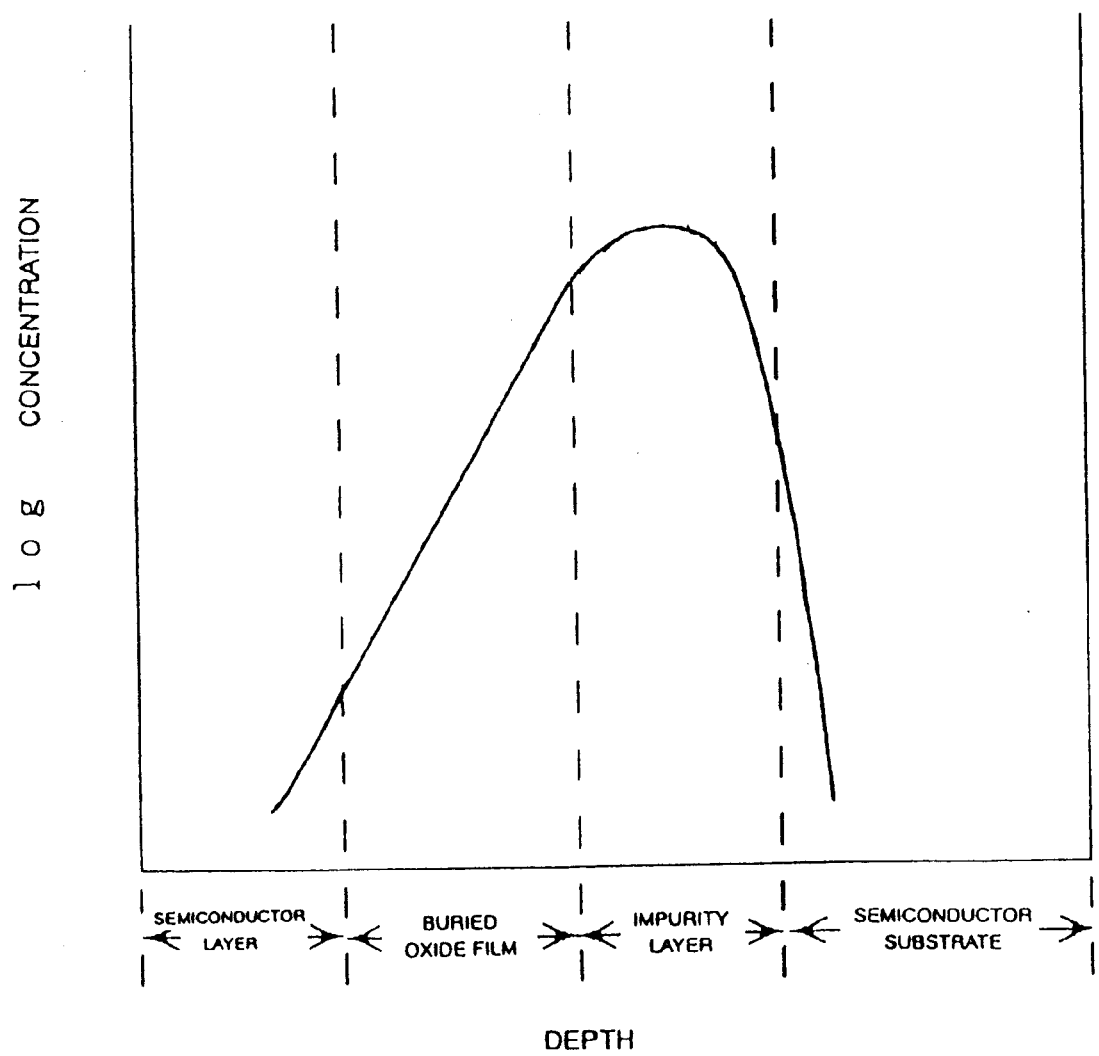
FIG. 11 is a graph showing concentration distributions of impurities contained in elements of the semiconductor device according to the first embodiment at one step of manufacturing.

A silicon oxide film having a thickness of about 300 to 800 nm (not shown) is formed over the entire surface by a low pressure CVD method. Then, a portion of the silicon oxide film on the surface of the silicon nitride film 32 is removed by a CMP (Chemical Mechanical Polishing) method by using the silicon nitride film 32 as a stopper, to leave the silicon oxide film only in the trench 41. After removal of the silicon nitride film 32 by wet etching using hot phosphoric acid, the silicon oxide film 31 is removed, to form an isolation insulating film 4. The cross-section of FIG. 10 shows the fragmentary structure of the semiconductor device at the stage after completion of the above step. Each of the channel stopper layer 11 and the impurity layer 12 may be formed by ion implantation at this stage. FIG. 11 is a graph showing the concentration distributions, along the E—E cross section of FIG. 10, of the impurities contained in the elements of the semiconductor device at this stage.

Figure 12:
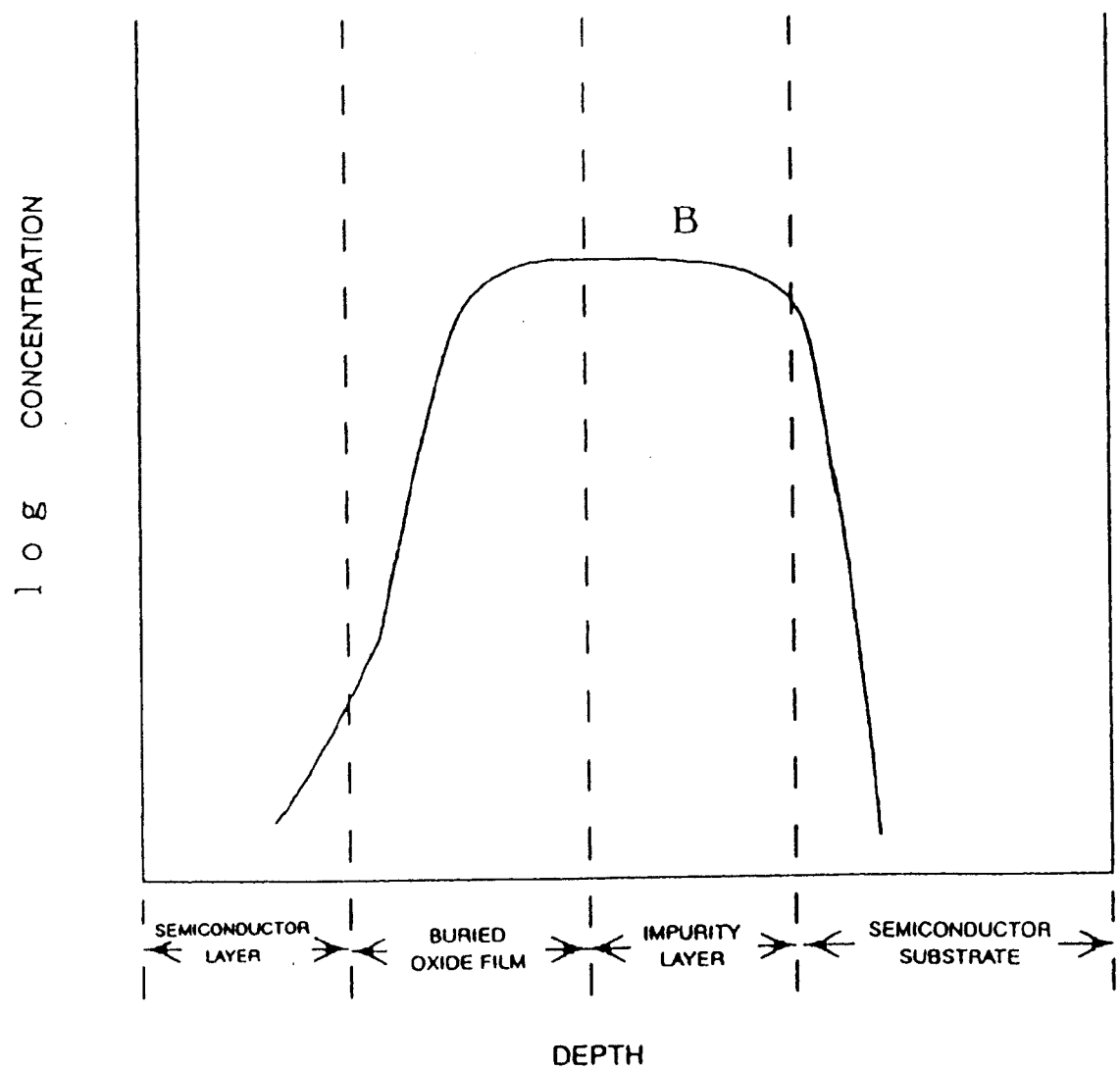
FIG. 12 is a graph showing concentration distributions of impurities contained in elements of the semiconductor device according to the first embodiment at another step of manufacturing.

If the substrate is subjected to a heat treatment of about 800 to 1100° C. so that the isolation insulating film 4 is made from silicon oxide, the film quality can be made dense, and the concentration of the impurity contained in the surface portion of the impurity layer 12 is increased to reduce the resistance of the impurity layer 12. FIG. 12 is a graph showing the concentration distributions, along the E—E cross section of FIG. 10, of the impurities contained in the elements of the semiconductor device at this stage.

Then, a silicon oxide film is formed over the entire surface (not shown) by thermal oxidation, and then ions of an impurity such as boron or boron fluoride for the nMOS or ions of an impurity such as phosphorus or arsenic for the pMOS are implanted over the entire surface at an energy of about 10 to 20 KeV and a dose of about $1\times10^{12}$ to $5\times10^{12}/cm^2$, to thus introduce the impurity in the channel formation region 10 for adjusting the threshold value (not shown). The silicon oxide film, which is provided for preventing the surface of the semiconductor substrate from being damaged upon ion implantation, is removed after ion implantation.

A silicon oxide film having a thickness of about 7 to 10 nm is formed on the entire surface of the semiconductor substrate 1 by thermal oxidation, to form a gate insulating film 5. Then, a polysilicon layer having a thickness of about 150 to 300 nm is formed by a CVD method, and is patterned by anisotropic etching using a photoresist mask (not shown), to form a gate electrode 6 made from polysilicon.

Figure 13:
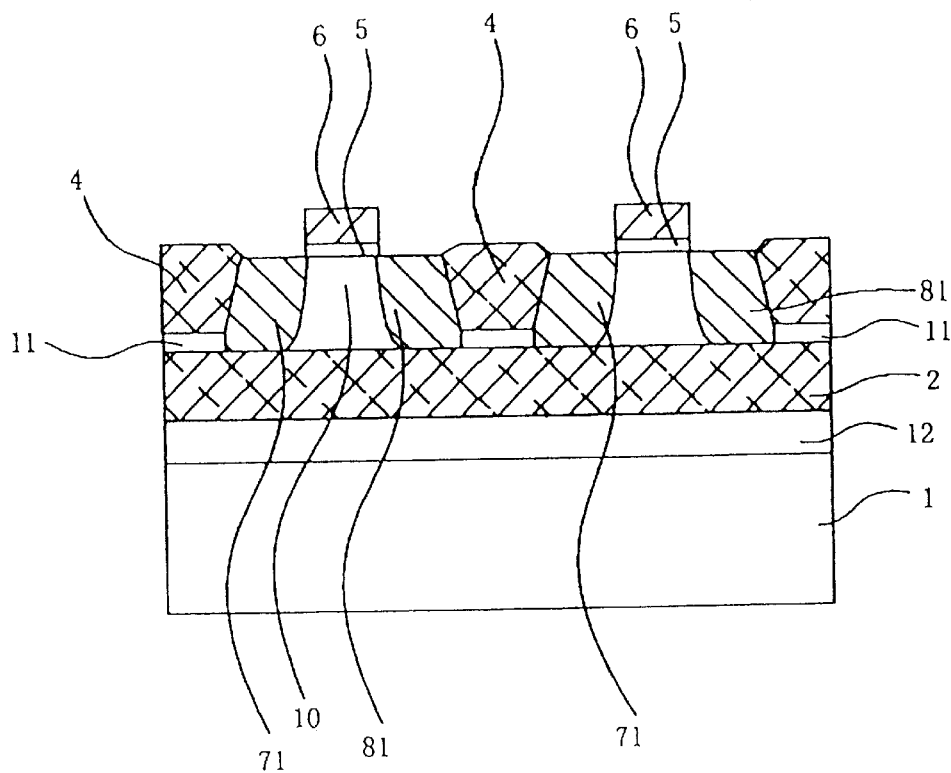

Ions of phosphorus or arsenic for the nMOS or boron or boron fluoride for the pMOS are implanted by using the photoresist mask at an energy of about 20 to 40 keV and a dose of about $1\times10^{13}$ to $5\times10^{14}/cm^2$, to form source/drain regions 71 and 81. The cross-section of FIG. 13 shows the fragmentary structure of the semiconductor device at the stage after completion of the above step.

A silicon oxide film having a thickness of about 30 to 100 nm is deposited over the entire surface and is etched-back, to form a side wall 13. Then, ions of arsenic for the nMOS or boron or boron fluoride for the pMOS are implanted at an energy of about 10 KeV and a dose of about $1\times10^{15}$ to $5\times10^{15}/cm^2$ to form source/drain regions 7 and 8. In order to allow the source/drain regions to be of the LDD structure as needed, the source/drain regions 7 and 8 may be often not formed. The impurity thus implanted is activated by annealing the substrate at about 800 to 900° C. for about 10 to 30 min. By subjecting the substrate to RTA (Rapid Thermal Annealing) at about 1050° C. for about 5 to 10 sec, it is possible to increase the activation rate of the impurity while suppressing the diffusion of the impurity.

The side wall 13 may be formed by a stacked structure of a silicon oxide film and a silicon nitride film. In this case, a silicon oxide film is formed by RTO (Rapid Thermal Oxidation) and a silicon nitride film is deposited thereon by the CVD method, and the stacked films are etched-back.

In the case of forming a metal silicide layer on the surfaces of the gate electrode 6 and the source/drain regions 7 and 8, cobalt is deposited over the entire surface at this stage and is subjected to RTA treatment, to react with exposed silicon, whereby a metal silicide layer is formed. After that, unreacted cobalt is removed (not shown).

A silicon oxide film having a thickness of about 200 to 600 nm is deposited by the low pressure CVD method, to form an interlayer insulating film 14. Contact holes 15, each having a diameter of 0.1 to 0.5 µm, reaching the source/drain regions 7 and 71 are formed in the interlayer insulating film 14 by a dry etching method. A wiring line material is deposited by the CVD method in such a manner as to be buried in the contact holes 15 and is patterned, to form wiring lines 9. Similarly, an interlayer insulating film 141 is formed, and contact holes 151 and wiring lines 91 reaching the source/drain regions 8 and 81 are formed. The semiconductor device shown in FIG. 1 is thus obtained.

While not shown, the contact hole 152 and wiring line 93 shown in FIG. 3 and the contact hole 153 and the wiring line 94 can be similarly formed. Also, the contact hole 154 and wiring line 95 shown in FIG. 4 can be similarly formed. The contact hole 154 and wiring line 95 may be formed at various method. For example, they may be formed simultaneously with the formation of the contact hole 153 and wiring line 94 after the formation of the interlayer insulating films 14 and 141, or may be formed after the formation of the isolation insulating film 4 or after the formation of the gate electrode 6. The formation of respective contact holes and wiring lines may be at a separate step as needed, and the formation order thereof can be also changed as needed. Also, a different interlayer insulating film and a different wiring line may be formed on the above-described wiring line, to form a multi-layer wiring line structure. Examples of the wiring line materials may include polysilicon doped with an impurity and a metal. In the case of a metal as the wiring line material, a barrier metal such as TiN is formed on the inner wall of each contact hole for preventing diffusion of the metal to the semiconductor layer 3.

According to the method of manufacturing the semiconductor device of the first embodiment, the impurity layer 12 is formed on the surface of the semiconductor substrate 1 of the semiconductor device having the SOI structure composed of the semiconductor substrate 1, buried oxide film 2, and semiconductor layer 3, and therefore, by fixing the potential of the impurity layer 12, even if a differential potential occurs between the source/drain regions of adjacent transistors having the same conduction type formed on the surface of the buried oxide film via the isolation insulating film having the partial STI structure, it is possible to suppress occurrence of a leakage current therebetween, and to enhance the breakdown voltage. As a result, there can be provided a semiconductor device having improved isolation characteristics while being miniaturized.

Further, since the impurity layer 12 can be formed not only in the isolation region but also under the active regions, even if the impurity implanted for forming the source/drain regions passes through the buried oxide film until reaching the semiconductor substrate, it is entrapped by the impurity layer formed on the surface of a semiconductor substrate. As a result, since the potential of the impurity layer is fixed, there is no fear of malfunction of the circuit, to improve the reliability of the semiconductor device.

Second Embodiment

Figure 14:
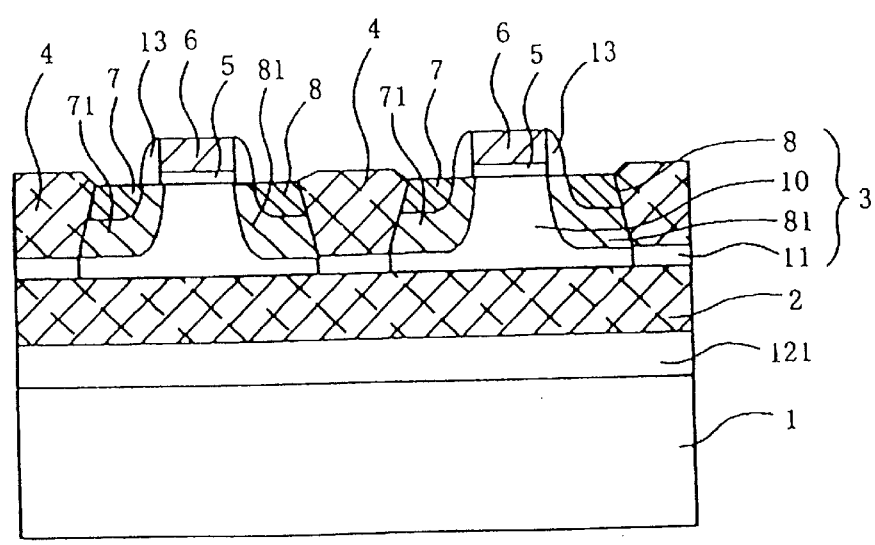
FIG. 14 is a sectional view showing a semiconductor device according to the second embodiment.

FIG. 14 is a sectional view, taken on line A—A of FIG. 2, of a semiconductor device according to a second embodiment of the present invention, in which reference numeral 121 designates an impurity layer. Referring to FIG. 14, source/drain regions 71 and 81 do not reach a buried oxide film 2, and the impurity layer 121 is doped with an impurity having the same conduction type as that of the source/drain regions. To be more specific, in the case where nMOS transistors are formed on the surface of the buried oxide film 2 in such a manner as to be adjacent to each other, the impurity layer 121 contains an n-type impurity such as phosphorus at a concentration of about $1 \times 10^{17}$ to $1 \times 10^{2}$/cm$^3$, and in the case where pMOS transistors are adjacent to each other, the impurity layer 121 contains a p-type impurity such as boron at a concentration of about $1 \times 10^{17}$ to $1 \times 10^{20}$/cm$^3$. The other film thicknesses and concentrations and kind of impurities are the same as those described in the first embodiment.

As compared with the first embodiment 1, this embodiment is advantageous in that since the joined area of the channel formation region 10 to the source/drain regions 71 and 81 becomes larger, the junction capacitance becomes larger; however, since the joined area of the channel formation region 10 to the channel stopper layer 11 becomes larger, the potential of the channel formation region 10 can be more certainly fixed.

The operation of the semiconductor device according to the second embodiment will be described. Referring to FIG. 14, for an nMOS transistor, when voltages are applied to the respective electrodes: $V_G$=about 0 to 1.8 V, $V_D$=about 0 to 1.8 V, and $V_S$=about 0 V, a channel is formed on the surface of the channel formation region 10 under the gate electrode 5, and either the source/drain regions 7 and 71 or the source/drain regions 8 and 81 are taken as source regions and the others are taken as the drain regions, to act as a circuit. At this time, 0 V is applied to the channel formation region 10, and the voltage $V_B$ applied to the semiconductor substrate 1 may be a value by which a reverse bias is applied between the impurity layer 121 and the semiconductor substrate 1. These voltages are for illustrative purposes only, and actually, the voltages are varied depending on the thickness of the gate insulating film and the gate length.

Figure 15:
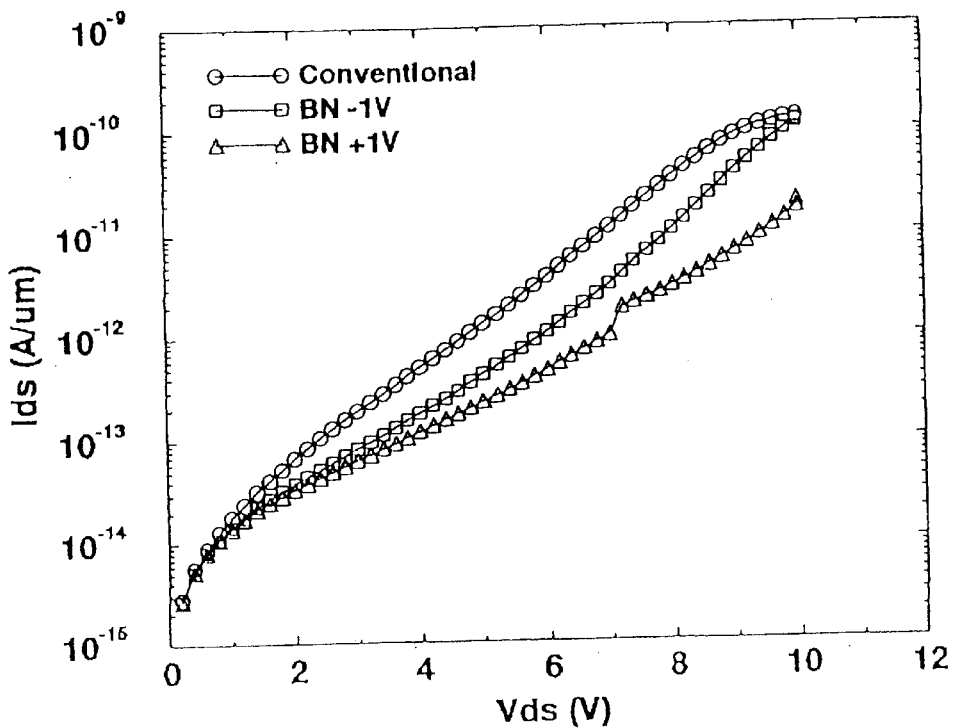
FIGS. 15 to 17 are graphs showing leakage currents of the semiconductor device according to the second embodiment.

FIG. 15 is a graph showing leakage currents of the semiconductor device according to the second embodiment shown in FIG. 14, obtained by simulation with the thickness of the semiconductor layer 3 set at 0.15 μm, the thickness of the buried oxide film 2 set at 40 nm, and the width of the isolation insulating film 4 set at 0.2 μm. In the graph, the abscissa designates a differential potential occurring between the source/drain regions 7, 71 and 8, 81 of the transistors adjacent to each other via the isolation insulating film 4, and the ordinate designates a leakage current occurring therebetween. In the figure, a curve (○) shows the data obtained in the case where the impurity layer 121 is not formed; a curve (□) shows the data obtained in the case where −1 V is applied to the impurity layer 121; and a curve (Δ) shows the data in the case where 1 V is applied to the impurity layer 121. As is apparent from the graph, the formation of the impurity layer 121 is effective to significantly reduce the leakage current.

In this embodiment, the impurity layer 121 is formed over the entire surface; however, the isolation characteristic can be improved by forming the impurity layer 121 only under a portion at which the partial STI is used for element isolation.

The arrangement of the wiring lines, the number of the interlayer insulating films formed between the substrate and the transistor, and the number of the transistors formed in one active region are for illustrative purposes only, and the present invention is not limited thereto.

Figure 16:
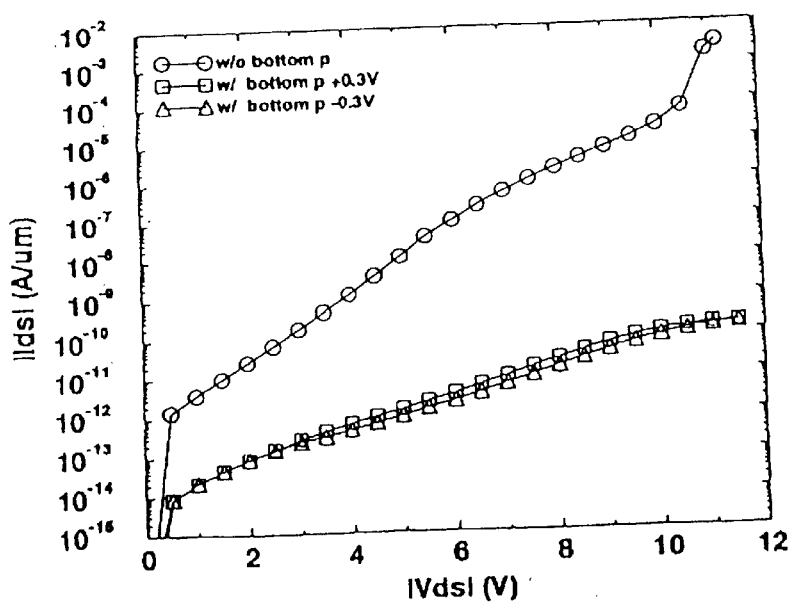

FIG. 16 is a graph showing leakage currents at a portion where the pMOS transistors are adjacent to each other in the semiconductor device according to the second embodiment. The effect of the present invention applied to the pMOS is the same as that applied to the nMOS. To be more specific, the present invention can be applied, even in the case of pMOS, to a portion at which the source/drain regions 7, 71 and 8, 81 are adjacent to each other via the partial STI and a differential potential occurs therebetween by the circuit configuration. For the pMOS transistors, the conduction type of each impurity region is reversed to that for the nMOS transistors excluding the semiconductor substrate 1; the applied voltages are set at $V_G$=about 0 to 1.8 V, $V_D$=about 0 to 1.8 V, and $V_S$=about 1.8 V; and 1.8 V is applied to the channel formation regions 10. In addition, an n-type impurity may be contained in polysilicon of the gate electrode 6.

The data shown in FIG. 16 is obtained by simulation using the semiconductor device shown in FIG. 14, with the thickness of the semiconductor layer 3 set at 0.15 μm, the thickness of the buried oxide film 2 set at 40 nm, and the width of the isolation insulating film 4 set at 0.2 μm. In the graph, the abscissa designates a differential potential occurring between the source/drain regions 7, 71 and 8, 81 of the transistors adjacent to each other via the isolation insulating film 4, and the ordinate designates a leakage current occurring therebetween. In the figure, a curve (○) shows the data obtained in the case where the impurity layer 121 is not formed; a curve (□) shows the data obtained in the case where 0.3 V is applied to the impurity layer 121; and a curve (Δ) shows the data in the case where −0.3 V is applied to the impurity layer 121. As is apparent from the graph, the formation of the impurity layer 121 is effective to significantly reduce the leakage current and to improve the breakdown voltage.

According to the semiconductor device of the second embodiment, the source/drain regions of a plurality of transistors having the same conduction type are formed on the buried oxide film so as not to reach the buried oxide film, and the impurity layer having the same conduction type as that of the transistors is formed on the semiconductor substrate for fixing the potential at a position under the isolation insulating film having the partial STI structure for isolating the transistors from each other. Accordingly, even if a differential potential occurs between the source/drain regions of the transistors adjacent to each other via the isolation insulating film, it is possible to suppress occurrence of a leakage current therebetween, and to enhance the breakdown voltage. As a result, there can be provided a semiconductor device having improved isolation characteristics while being miniaturized.

Since an electric field between the source/drain regions 71 and 81 and the semiconductor layer 3 disposed thereunder is relaxed by applying a voltage to the impurity layer 121, a leakage current occurring due to BTBT (Band to Band Tunneling), TAT (Trap Assisted Tunneling), SRH (Shockley-Read-Hall), impact ionization, etc. is reduced, to thereby lower the power consumption.

In the case where the impurity layer 121 is formed not only under the isolation insulating film but also under the source/drain regions 71 and 81, even if the impurity implanted for forming the source/drain regions passes through the buried oxide film 2 until reaching the semiconductor substrate 1, it is entrapped by the impurity layer formed on the surface of a semiconductor substrate. As a result, since the potential of the impurity layer 121 is fixed, there is no fear of malfunction of the circuit, to improve the reliability of the semiconductor device.

In the case of a transistor used as a sense amplifier (crosslinking or cross-coupled type amplifier), like the first embodiment, the channel formation regions of the adjacent transistors may be floated and be shared with each other.

Figure 17:
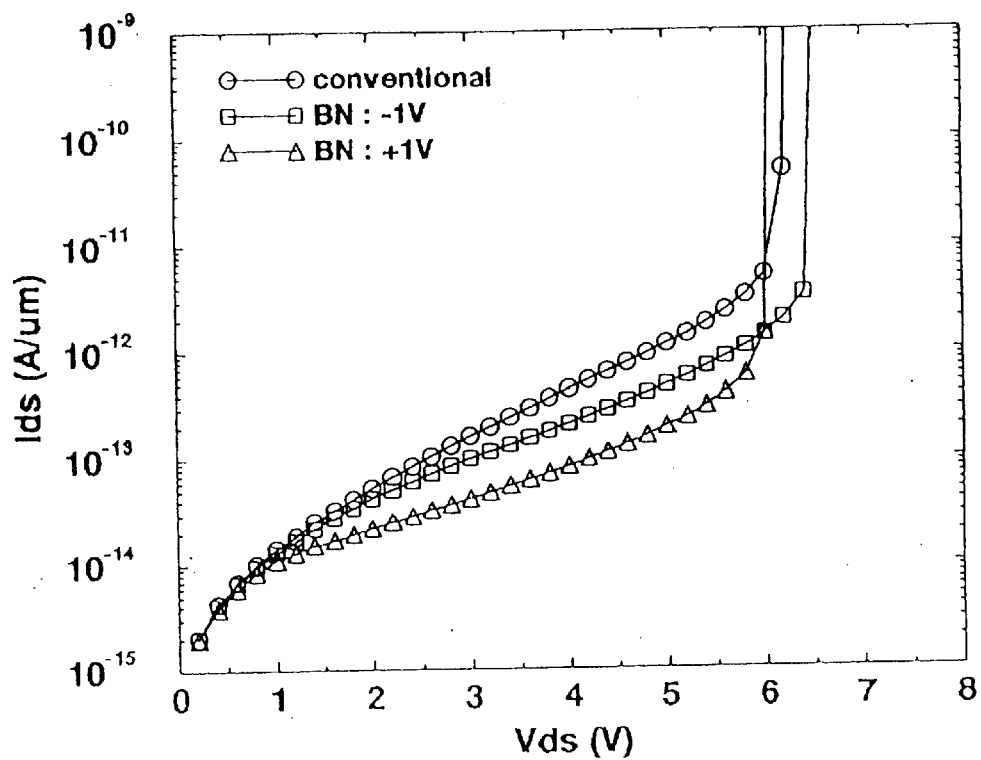

FIG. 17 is a graph showing leakage currents of the semiconductor device according to the second embodiment shown in FIG. 14, obtained by simulation under a condition in which the thickness of the semiconductor layer 3 is set at 0.15 μm, the thickness of the buried oxide film 2 is set at 40 nm, and the width of the isolation insulating film 4 is set at 0.2 μm when the nMOS transistors are adjacent to each other; and no voltage is applied to the channel formation region 10. In the graph, the abscissa designates a differential potential occurring between the source/drain regions 7, 71 and 8, 81 of the transistors adjacent to each other via the isolation insulating film 4, and the ordinate designates a leakage current occurring therebetween. In the figure, a curve (○) shows the data obtained in the case where the impurity layer 121 is not formed; a curve (Δ) shows the data in the case where 1 V is applied to the impurity layer 121; and a curve (□) shows the data in the case where −1 V is applied to the impurity layer 121. As is apparent from the graph, the leakage current is significantly reduced and the breakdown voltage is improved by forming the impurity layer 121 and applying a reverse bias to the impurity layer 121 with respect to the semiconductor substrate 1.

In the semiconductor device, the isolation insulating film having the partial STI structure is formed for isolating a plurality of transistors having the same conduction type and formed on the buried oxide film. The source/drain regions of the transistors adjacent to each other via the isolation insulating film do not reach the buried oxide film. Since the channel formation regions are floated to be shared them with each other, it is possible to accurately set the threshold voltages thereof. Further, since the impurity layer having the same conduction type as that of the transistors is formed on the surface of the semiconductor substrate at a position under the isolation insulating film and the potential of the impurity layer is fixed, even if a differential potential occurs between source/drain regions adjacent to each other via the isolation insulating film, it is possible to suppress occurrence of a leakage current generated therebetween and also to enhance the breakdown voltage. As a result, there can be provided a semiconductor device having improved isolation characteristics while being miniaturized.

A method of manufacturing the semiconductor device according to the second embodiment will be described below.

Figure 18:
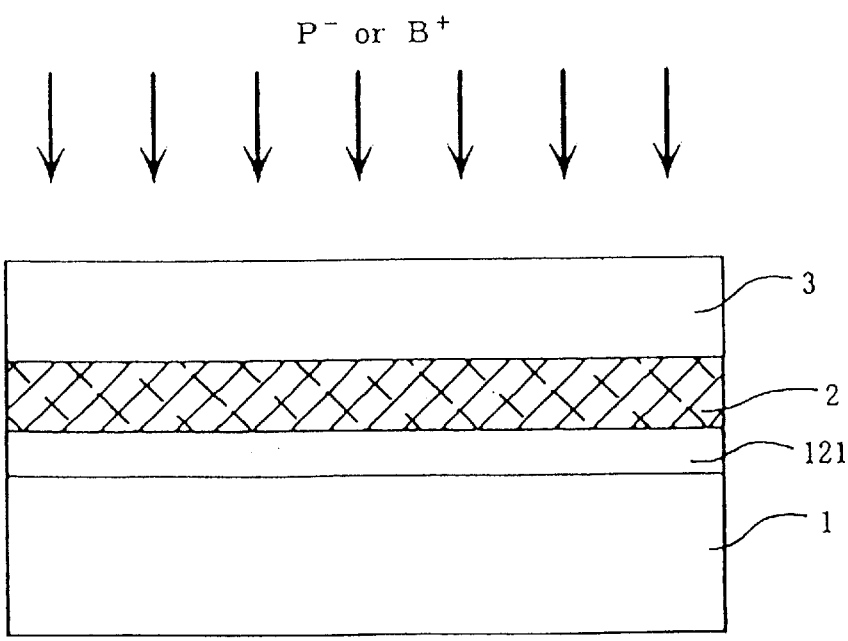
FIG. 18 is a sectional view of a semiconductor device according to the second embodiment at one step of manufacturing.

FIG. 18 is a sectional view of a fragmentary structure of the semiconductor device according to the second embodiment, showing one step of manufacturing the semiconductor device.

Referring to FIG. 18, ions of an n-type impurity such as phosphorus for an nMOS or ions of a p-type impurity such as boron for a pMOS are implanted in the surface of an SOI substrate including a buried oxide film 2 and a semiconductor layer 3 on the surface of a semiconductor substrate 1, to form an impurity layer 121 between the semiconductor substrate 1 and the buried oxide film 2. The cross-section of FIG. 18 shows the fragmentary structure of the semiconductor device at the stage after completion of the above step. The implantation condition differs depending on the thickness of the buried oxide film 2. The p-type impurity such as boron is implanted at an energy of about 200 to 300 keV and a dose of about $1 \times 10^{13}$ to $1 \times 10^{14}$/cm$^2$ when the thickness of the buried oxide film is about 0.04 μm, and is implanted at an energy of about 500 to 600 keV and a dose of about $1 \times 10^{13}$ to $1 \times 10^{14}$/cm$^2$ when the thickness of the buried oxide film is about 0.4 μm. The n-type impurity such as phosphorus is implanted at an energy of about 200 to 300 keV and a dose of about $1 \times 10^{12}$ to $1 \times 10^{14}$/cm$^2$ when the thickness of the buried oxide film is about 0.04 μm, and is implanted at an energy of about 500 to 600 keV and a dose of about $1 \times 10^{13}$ to $1 \times 10^{14}$/cm$^2$ when the thickness of the buried oxide film is about 0.4 μm.

Next, like the first embodiment, a channel stopper layer 11 and an isolation insulating film 4 are formed, and an impurity for adjusting the threshold value is introduced in a channel formation region 10 (not shown).

Further, like the first embodiment, a gate insulating film 5 and a gate electrode 6 are formed, and ions of phosphorus or arsenic for the nMOS or ions of boron or boron fluoride for the pMOS are implanted at an energy of about 10 to 30 KeV and a dose of about $1 \times 10^{13}$ to $5 \times 10^{14}/cm^2$ as needed, to form source/drain regions 71 and 81. In the case of forming impurity regions (pocket layers, not shown) having the reversed conduction type in such a manner as to surround the source/drain regions, ions of an impurity such as boron for the nMOS or ions of an impurity such as phosphorus for the pMOS are implanted at an energy of about 10 KeV and a dose of about $1 \times 10^{12}$ to $1 \times 10^{13}/cm^2$ (not shown). Then, a side wall 13 is formed, and ions of arsenic for the nMOS or ions of boron or boron fluoride for the pMOS are implanted at an energy of about 10 KeV and a dose of about 1 to $5 \times 10^{15}/cm^2$, to form source/drain regions 7 and 8.

Like the first embodiment, insulating films 14 and 141, contact holes 15 and 151 to 154, wiring lines 9 and 91 to 95 are formed.

According to the method of manufacturing the semiconductor device of the second embodiment, the impurity layer 121 can be formed on the surface of the semiconductor substrate 1 of the semiconductor device having the SOI structure including the semiconductor substrate 1, buried oxide film 2 and the semiconductor layer 3, and the transistors having the source/drain regions having the same conduction type as that of the impurity layer 121 can be formed on the surface of the buried oxide film 2. Accordingly, by fixing the potential of the impurity layer 121, even if a differential potential occurs between source/drain regions adjacent to each other via the isolation insulating film having the partial STI structure, it is possible to suppress occurrence of a leakage current generated therebetween and also to enhance the breakdown voltage. As a result, it is possible to realize a semiconductor device having a micro-structure, capable of improving the isolation characteristic in spite of the micro-structure.

Further since the impurity layer 121 can be formed not only in the isolation region but also under the active regions, even if the impurity implanted for forming the source/drain regions passes through the buried oxide film 2 until reaching the semiconductor substrate 1, it is entrapped by the impurity layer formed on the surface of a semiconductor substrate. As a result, since the potential of the impurity layer 121 is fixed, there is no fear of malfunction of the circuit, to improve the reliability of the semiconductor device.

Third Embodiment

Figure 19:
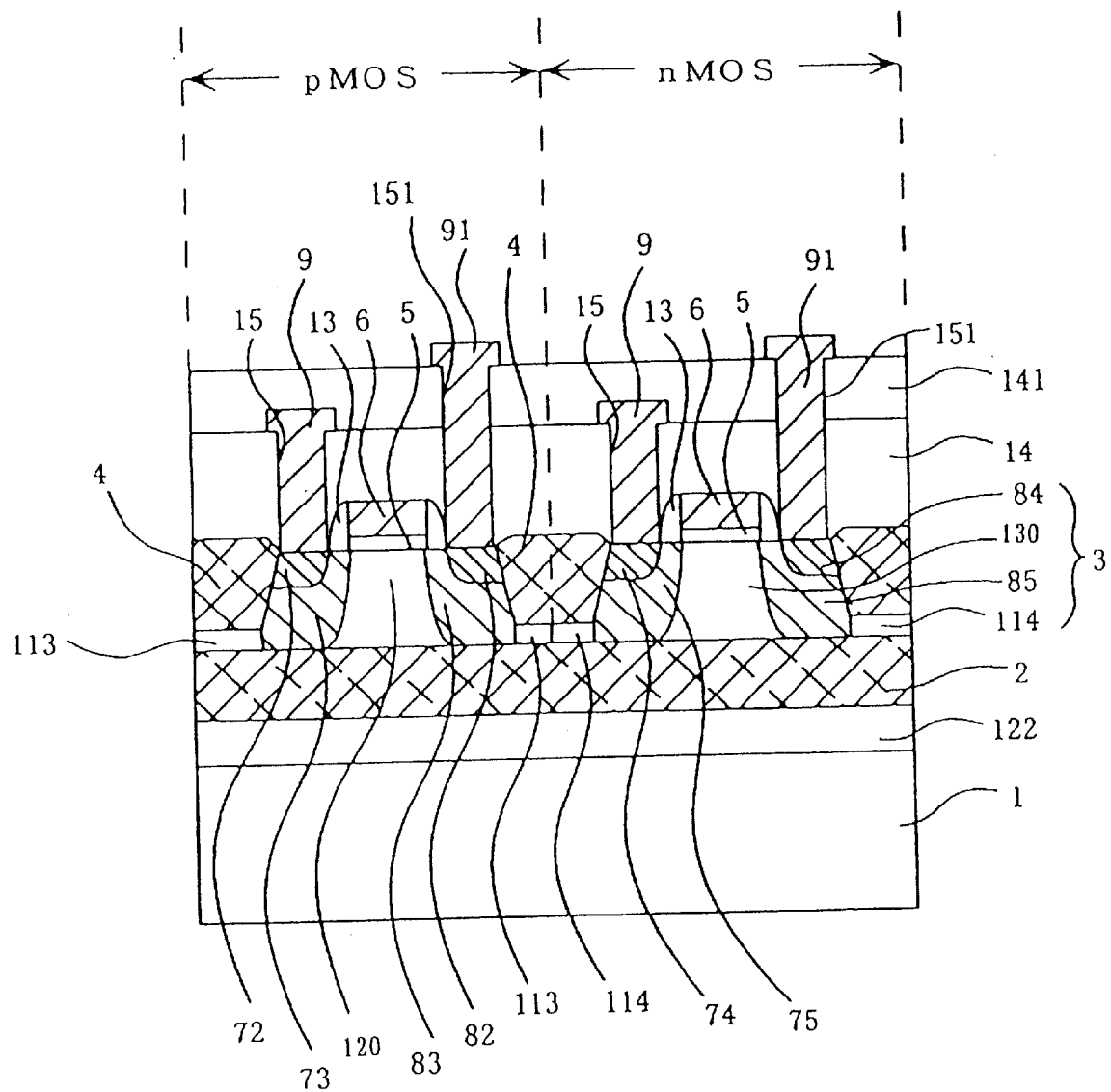
FIG. 19 is a sectional view of a semiconductor device according to a third embodiment of the present invention.

FIG. 19 is a sectional view of a semiconductor device according to a third embodiment of the present invention. In the figure, reference numeral 72 to 75 and 82 to 85 are source/drain regions; 120 and 130 are channel formation regions; 113 and 114 are channel stopper layers; and 122 is an impurity layer. In this embodiment, one of transistors adjacent to each other via an isolation insulating film 4 (partial STI) is an nMOS and the other is a pMOS. With the thickness of the buried oxide film 2 in a range of about 0.04 to 0.4 μm, the impurity layer 122 has the same thickness as that in the first and second embodiments and contains an n-type impurity such as phosphorus at a concentration of about $5 \times 10^{17}$ to $1 \times 10^{20}/cm^3$: the channel stopper layer 113 contains an n-type impurity such as phosphorus at a concentration of about $1 \times 10^{17}$ to $1 \times 10^{20}/cm^3$; the channel stopper layer 114 contains a p-type impurity such as boron at a concentration of about $1 \times 10^{17}$ to $1 \times 10^{18}/cm^3$; the channel formation region 120 contains an n-type impurity such as phosphorus at a concentration of about $5 \times 10^{17}$ to $2 \times 10^{18}/cm^3$; and the channel formation region 130 contains a p-type impurity such as boron at a concentration of about $5 \times 10^{17}$ to $1 \times 10^{18}/cm^3$. The kinds and concentrations of impurities in the source/drain regions and gate electrode are the same as those in the first embodiment.

Figure 20:
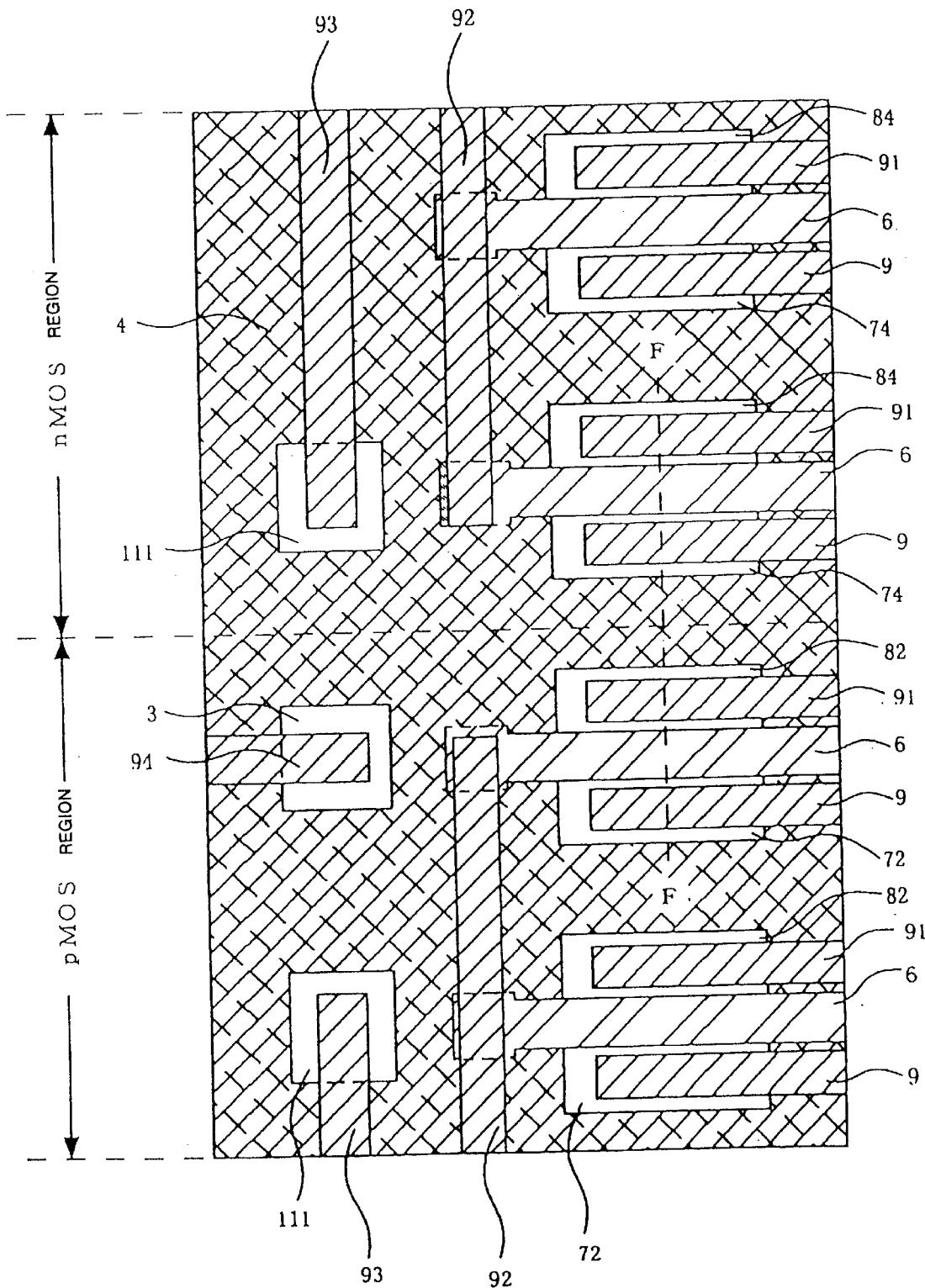
FIG. 20 is a top view of the semiconductor device according to the third embodiment.

FIG. 20 is a top view of the semiconductor device according to the third embodiment. FIG. 19 is a sectional view taken on line F—F of FIG. 20. In FIG. 20, under an isolation insulating film 4 in the pMOS region is formed the channel stopper layer 113, and under the isolation insulating film 4 in the nMOS region is formed the channel stopper layer 114.

At least one wiring line 94 for fixing the potential of the impurity layer 122 may be formed commonly in the pMOS and nMOS regions.

Like the structure of the first embodiment shown in FIG. 3, potential of the channel formation regions 120 is fixed through the channel stopper layers 113 and a wiring line connected to impurity region 111 having a conduction type of pMOS. Similarly, potential of the channel formation region 130 is fixed through the channel stopper layer 114 and a wiring line connected to impurity regions 111 having a conduction type of nMOS.

The operation of the semiconductor device according to the third embodiment will be described. Referring to FIG. 19, for an nMOS transistor, when voltages, $V_G=1.8$ V, $V_D=1.8$ V and $V_S=0$ V are applied to the respective electrodes and about 0 V is applied to the channel formation region 130, a channel is formed to act as a circuit. For a pMOS transistor, when voltages, $V_G=0$ to 1.8 V, $V_D=0$ to 1.8 V and $V_S=1.8$ V are applied to the respective electrodes and about 1.8 V is applied to the channel formation region 120, a channel is formed to allow a current to flow therethrough.

Further, 1.8 V is applied to the channel stopper layer 113; 0 V is applied to the channel stopper layer 114; and about 4 V is applied to the impurity layer 122. These voltages may be increased or decreased as needed. These voltages are for illustrative purposes only, and actually, the voltages are varied depending on the thickness of the gate insulating film and the gate length.

Figure 21:
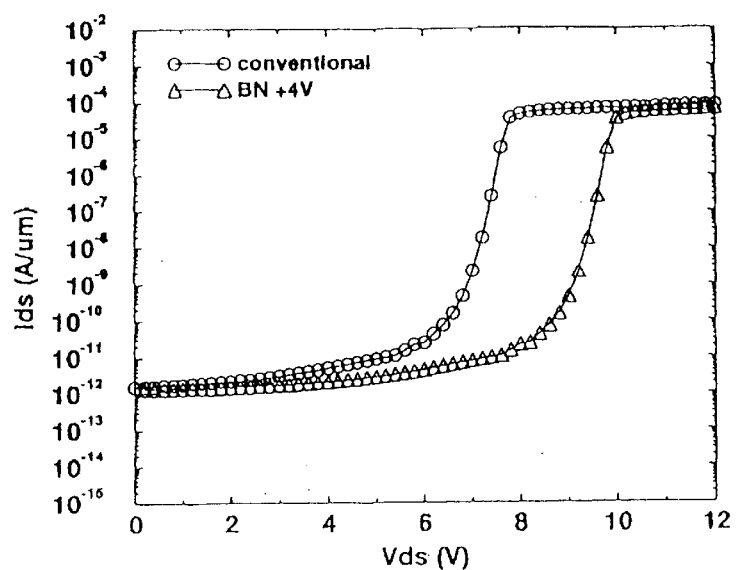
FIG. 21 is a graph showing leakage currents of the semiconductor device according to the third embodiment.

FIG. 21 is a graph showing leakage currents of the semiconductor device according to the third embodiment shown in FIG. 19, obtained by simulation with the thickness of the semiconductor layer 3 set at 0.15 μm, the thickness of the buried oxide film 2 set at 0.4 μm, and the width of the isolation insulating film 4 set at 0.2 μm. In the graph, the abscissa designates a differential potential occurring between the source/drain regions 7, 71 and 8, 81 of the transistors adjacent to each other via the isolation insulating film 4, and the ordinate designates a leakage current occurring therebetween. In the figure, a curve (○) shows the data obtained in the case where the impurity layer 122 is not formed, and a curve (Δ) shows the data obtained in the case where 4 V is applied to the impurity layer 122. As is apparent from the graph, the formation of the impurity layer 122 is effective to significantly reduce the leakage current and to improve the breakdown voltage.

In this embodiment, the impurity layer 122 is formed over the entire surface; however, the isolation characteristic can be improved by forming the impurity layer 122 only under a portion at which the partial STI is used for element isolation.

Further, in this embodiment, description is made by example of the portion in which the nMOS is adjacent to the pMOS; however, the same is true for the diodes. To be more specific, the present invention can be applied to a portion in which impurity regions, whose conduction types are reversed to each other, of two transistors are adjacent to each other via the isolation insulating film having the partial STI structure and a differential potential occurs by the circuit arrangement.

Figure 22:
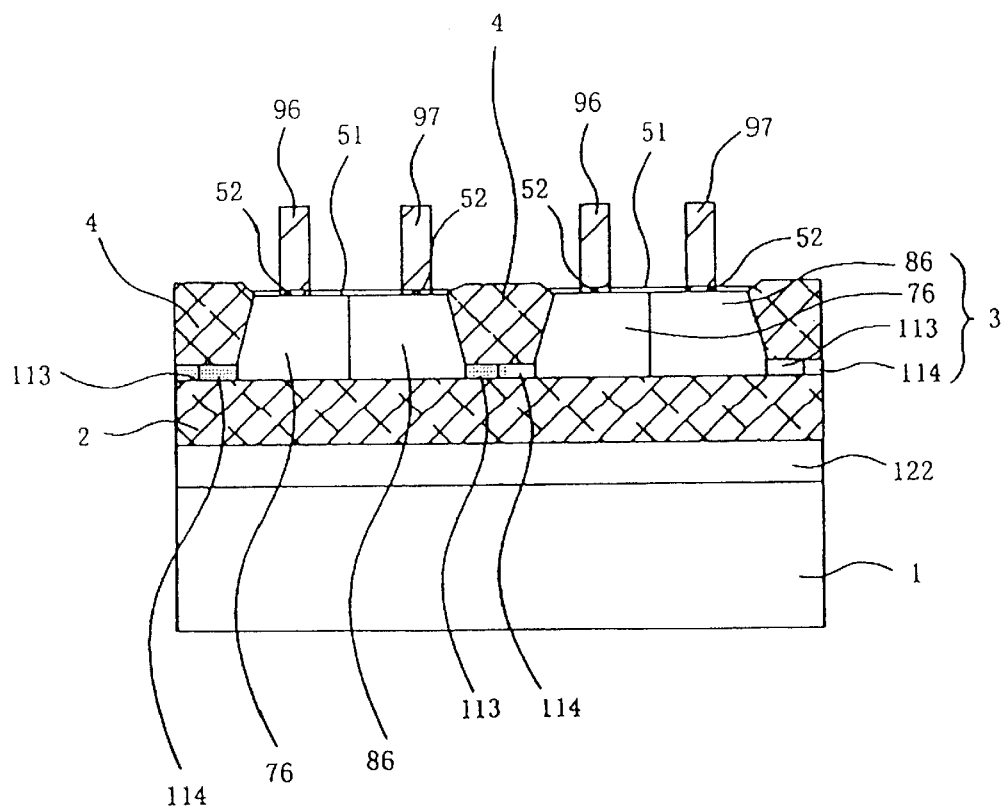
FIG. 22 is a sectional view of a semiconductor device as one variation of the third embodiment.

FIG. 22 is a sectional view of a semiconductor device as one variation of the third embodiment of the present invention. In the figure, reference numeral 76 designates an n-type impurity region; 86 is a p-type impurity region; 51 is an insulating film; 52 is a barrier metal; and 96 and 97 are wiring lines. Referring to FIG. 22, in the case where diodes are adjacent to each other, the p-type impurity region 86 is formed in such a manner as to be adjacent to a channel stopper layer 113 and the n-type impurity region 74 is formed in such a manner as to be adjacent to the channel stopper layer 114, and the impurity regions are controlled by the wiring lines 96 and 97 connected thereto via the barrier metals 52.

Like the first embodiment, the number and arrangement of interlayer insulating films formed between the semiconductor substrate and the transistor differs depending on the circuit configuration. Further, while the semiconductor device in which one transistor is formed in one active region is illustrated in this embodiment, the present invention is not limited thereto by may be applied to a semiconductor device in which a plurality of transistors are formed in one active region.

According to the semiconductor device having the SOI structure as the third embodiment, a plurality of the pMOS transistors and a plurality of nMOS transistors may be formed via the isolation insulating film having the partial STI structure, and the potentials of the channel formation regions in respective regions may be commonly fixed. On the surface of the semiconductor substrate underneath the buried oxide film is formed the impurity layer having the conduction type reversed to that of the semiconductor substrate. At the portion in which the nMOS transistor and the pMOS transistor are adjacent to each other are arranged the p-type and n-type channel stopper layers under the isolation insulating film. Specifically, the channel stopper layers are arranged in such a manner that the conduction types of impurity regions in the transistors have the pnpn repeated relationship with each other so as to fix the potentials thereof. Accordingly, even if a differential potential occurs between the source/drain regions, which have the reversed conduction types, of the transistors adjacent to each other via the isolation insulating film having the partial STI structure, it is possible to suppress occurrence of a leakage current therebetween, and to enhance the breakdown voltage. As a result, there can be provided a semiconductor device having improved isolation characteristics while being miniaturized.

In the case where the pMOS transistor is adjacent to the nMOS transistor and the impurity layer 122 is formed not only in the isolation region but also under the source/drain regions 73, 74, 83 and 84, even if the impurity implanted for forming the source/drain regions passes through the buried oxide film 2 until reaching the semiconductor substrate 1, it is entrapped by the impurity layer formed on the surface of a semiconductor substrate. As a result, since the potential of the impurity layer 122 is fixed, there is no fear of malfunction of the circuit, to improve the reliability of the semiconductor device.

Figure 23:
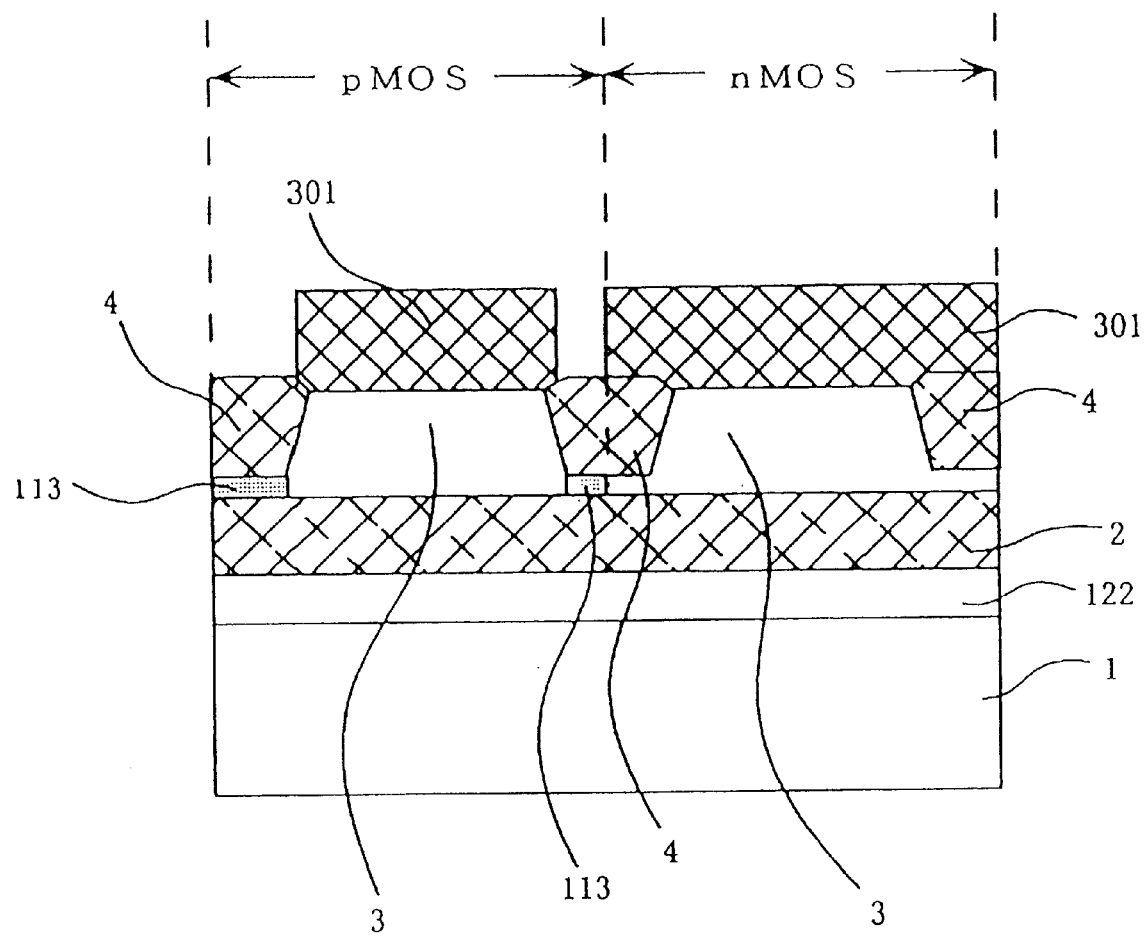
FIG. 23 is a sectional view of the semiconductor device according to the third embodiment at one step of manufacturing.
Figure 24:
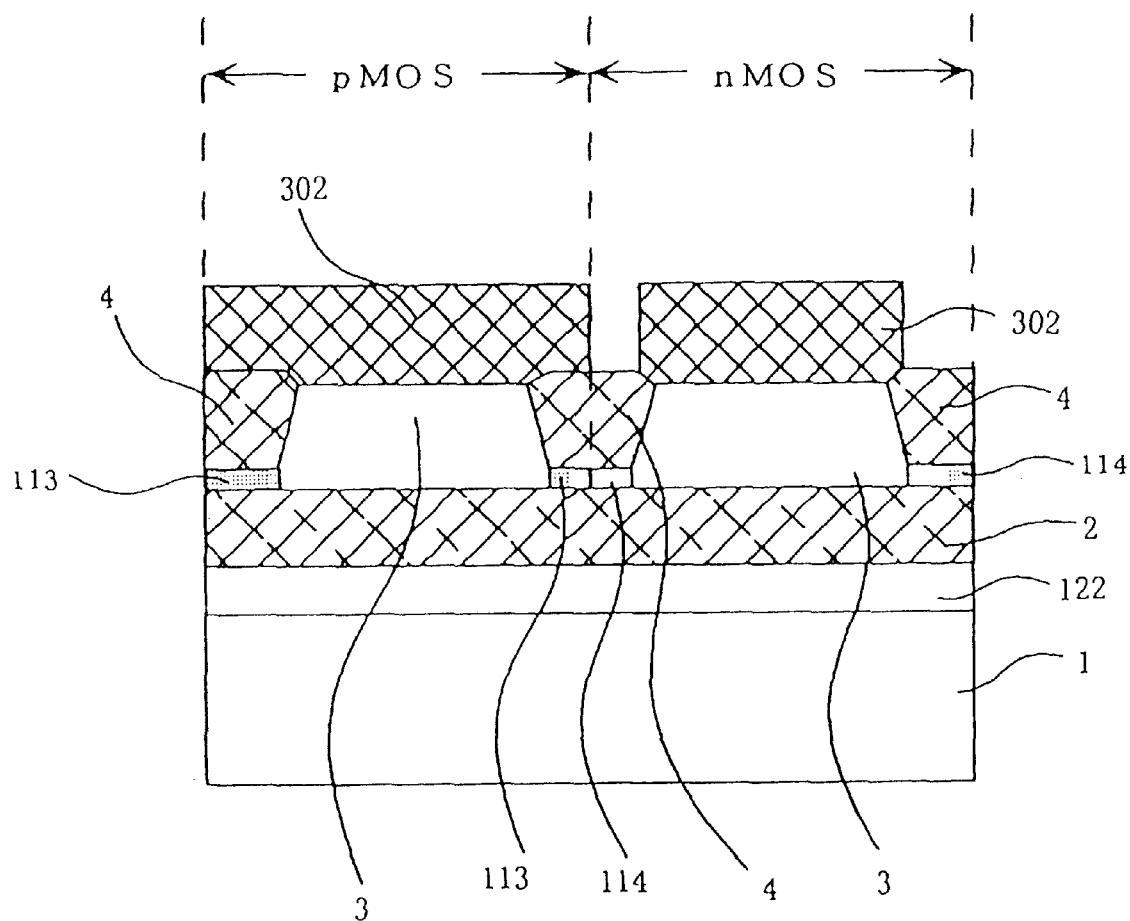
FIG. 24 is a sectional view of the semiconductor device according to the third embodiment at another step of manufacturing.

A method of manufacturing the semiconductor device as the third embodiment will be described below. FIGS. 23 and 24 are sectional view of fragmentary structures of the semiconductor device according to the third embodiment, showing the sequential steps of manufacturing the semiconductor device. In FIG. 23, reference numeral 301 designates a photoresist mask.

Like the first embodiment, ions of an n-type impurity such as phosphorus are implanted in the surface of an SOI substrate including a semiconductor layer 3 and a buried oxide film 2 on the surface of a semiconductor substrate 1, to form an impurity layer 122 between the semiconductor substrate 1 and the buried oxide film 2.

Next, like the first embodiment, an isolation insulating film 4 is formed in an isolation region, and then a photoresist mask 301 having an opening over the isolation insulating film in the pMOS region is formed, and ions of an n-type impurity such as phosphorus are implanted over the entire surface by using the photoresist mask 301 at an energy of about 110 to 130 KeV and a dose of about $1 \times 10^{13}$ to $5 \times 10^{13}/cm^2$, to form a channel stopper layer 113. The cross-section of FIG. 23 shows the fragmentary structure of the semiconductor device at the stage after completion of the above step.

FIG. 24 is a sectional view of a fragmentary structure of the semiconductor device according to the third embodiment, showing one step of manufacturing the semiconductor device. In the figure, reference numeral 302 designates a photoresist. Referring to FIG. 24, after removal of the photoresist mask 301, a photoresist 302 having an opening over the isolation insulating film in the nMOS region is formed, and then ions of a p-type impurity such as boron are implanted over the entire surface by using the photoresist mask 302 at an energy of about 30 to 50 KeV and a dose of about $5 \times 10^{12}$ to $1 \times 10^{13}/cm^2$, to form a channel stopper layer 114. The cross-section of FIG. 24 shows the fragmentary structure of the semiconductor device at the stage after completion of the above step.

In the third embodiment, the channel stopper layer is formed after the formation of the isolation insulating film 4, whereas the channel stopper layer 11 in the first embodiment is formed before the formation of the isolation insulating film 4.

Like the first embodiment, a silicon oxide film is formed over the entire surface by thermal oxidation (not shown), and a photoresist mask having an opening in the pMOS region is formed (not shown) and ions of an n-type impurity such as phosphorus or arsenic are implanted over the entire surface by using the photoresist mask at an energy of about 10 to 20 KeV and a dose of about $1 \times 10^{12}$ to $5 \times 10^{12}/cm^2$, to introduce the impurity for adjusting the threshold voltage in the channel formation region 120. After removal of the photoresist (not shown), a photoresist mask having an opening in the nMOS region is formed (not shown) and ions of a p-type impurity such as boron or boron fluoride are implanted over the entire surface by using the photoresist mask at an energy of about 10 to 20 KeV and a dose of about $1 \times 10^{12}$ to $5 \times 10^{12}/cm^2$, to introduce the impurity for adjusting the threshold voltage in the channel formation region 130. The photoresist is then removed (not shown).

Like the first embodiment, a gate insulating film 5, a gate electrode 6, source/drain regions 72, 73, 82 and 83 in the pMOS region, source/drain regions 74, 75, 84 and 85 in the nMOS region, a side wall 13, interlayer insulating films 14 and 141, contact holes 15 and 151, and wiring lines 9 and 91 are formed. In this way, the semiconductor device shown in FIG. 19 is formed. The formation order of the contact holes and wiring lines including those not shown in the figure can be changed as needed like the first embodiment. Further, interlayer insulating films and wiring lines not depicted in FIG. 19 may be formed on the above-described structure of FIG. 19, to form a multi-layered wiring line structure.

According to the method of manufacturing the semiconductor device as the third embodiment, the impurity layer 122 can be formed on the surface of the semiconductor substrate 1 of the semiconductor device having the SOI substrate composed of the semiconductor substrate, buried oxide film and semiconductor layer; the n-type channel stopper layer can be formed under the isolation insulating film for isolating a plurality of the pMOS transistors from each other and the p-type channel stopper layer can be formed under the isolation insulating film for isolating a plurality of the nMOS transistors from each other; and the p-type and n-type channel stopper layers can be formed under the isolation insulating film for isolating the pMOS transistor from the nMOS transistor in such a manner that the conduction types of impurity regions in the transistors have the pnpn repeated relationship with each other.

Since the potentials of the impurity layer 122 and the p-type and n-type channel stopper layers are fixed, the potentials of the channel formation regions 10 for the pMOS transistor and nMOS transistor can be commonly fixed, and even if a differential potential occurs between the source/drain regions of the pMOS transistor and nMOS transistor adjacent to each other via the isolation insulating film having the partial STI structure, it is possible to suppress occurrence of a leakage current generated therebetween and also to enhance the breakdown voltage. As a result, it is possible to realize a semiconductor device having a micro-structure, capable of improving the isolation characteristic in spite of the micro-structure.

Further, in the case where the pMOS transistor and the nMOS transistor are adjacent to each other, the impurity layer 122 can be formed not only in the isolation region but also under the active regions. Accordingly, even if the impurity implanted for forming the source/drain regions passes through the buried oxide film 2 until reaching the semiconductor substrate 1, since the potential of the impurity layer 122 is fixed, there is no fear of malfunction of the circuit, to improve the reliability of the semiconductor device.

Fourth Embodiment

Figure 25:
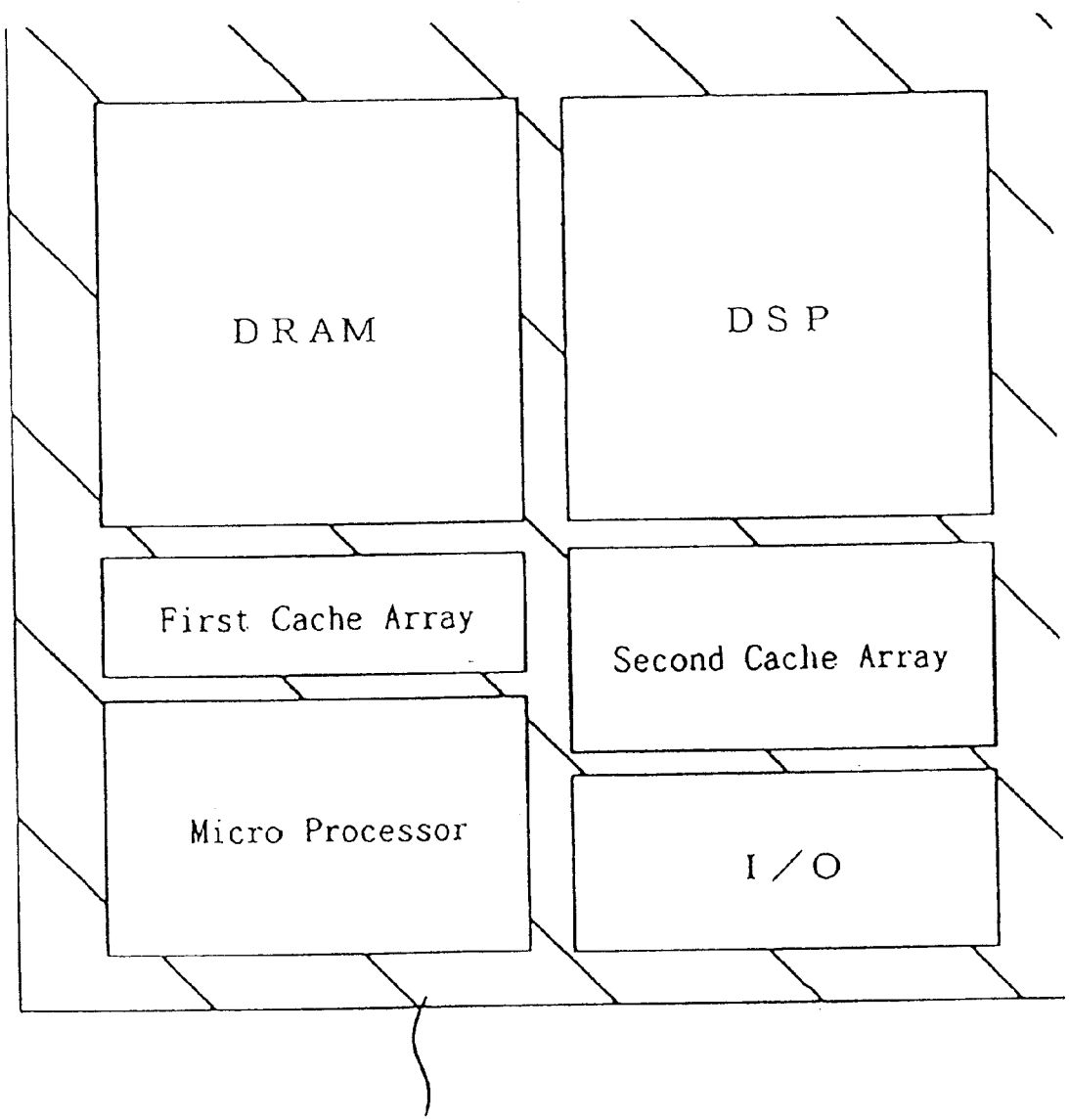
FIG. 25 is a plan view of a semiconductor device according to a fourth embodiment of the present invention.
Figure 26:
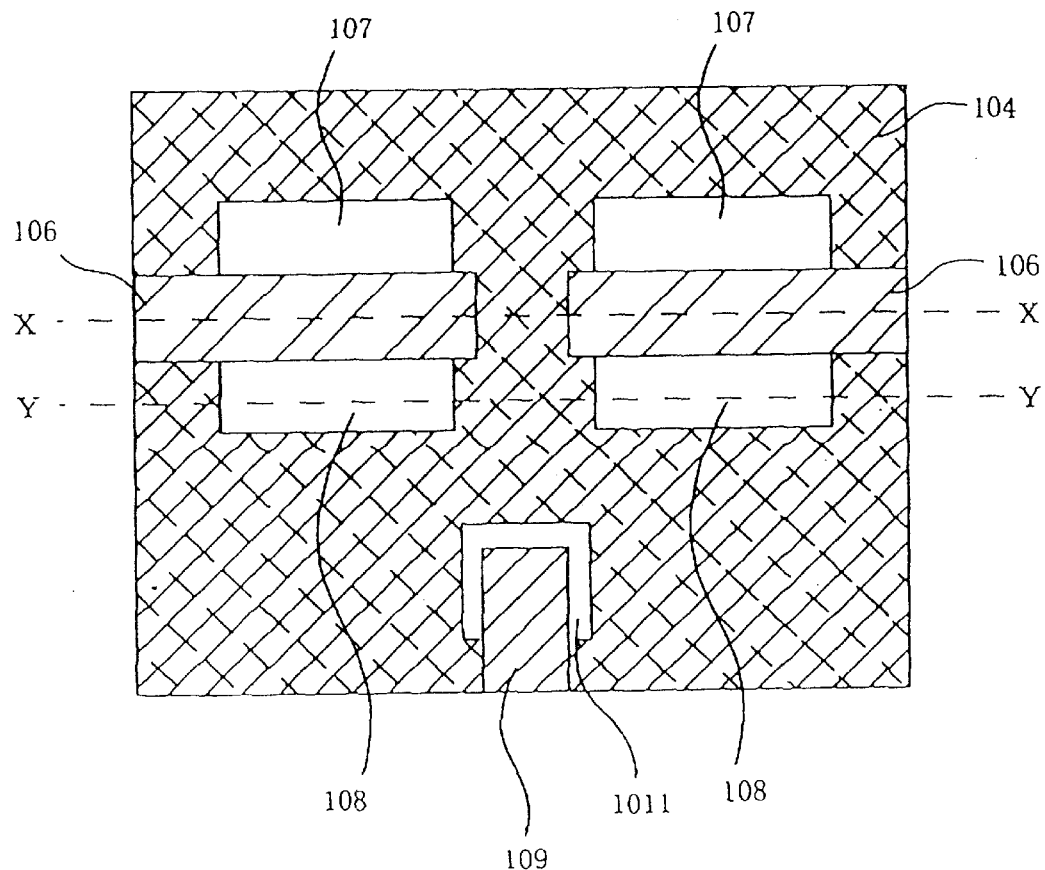
FIG. 26 is a top view showing a conventional semiconductor device.
Figure 27:
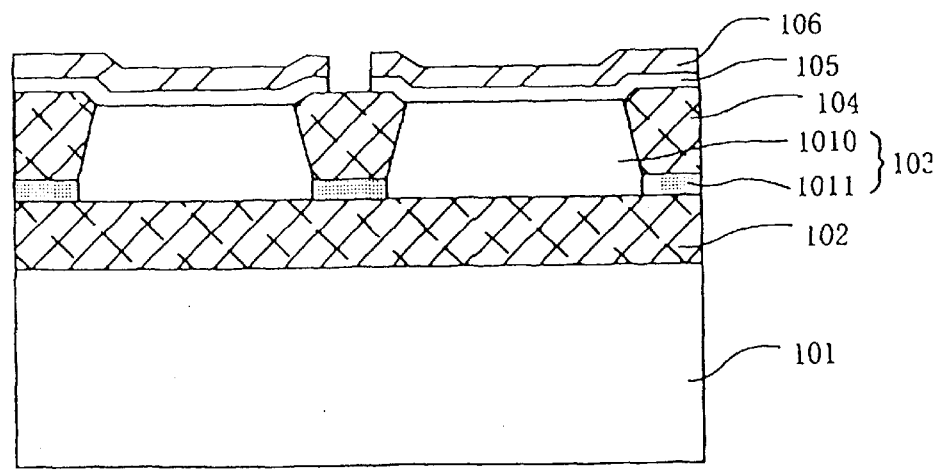
FIG. 27 is a sectional view, taken on line X—X of FIG. 26, of the conventional semiconductor device.
Figure 28:
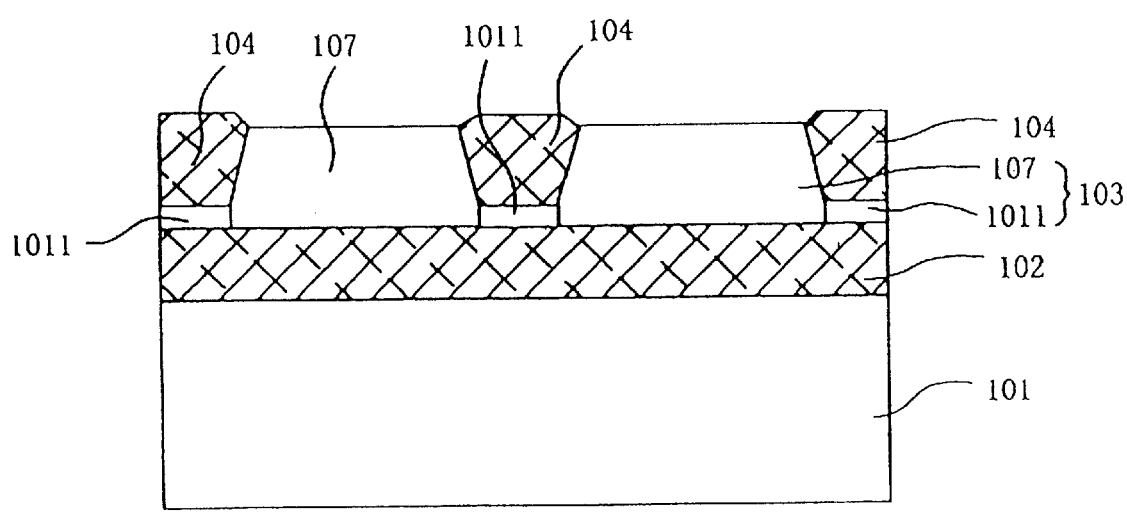
FIG. 28 is a sectional view, taken on line Y—Y of FIG. 26, of the conventional semiconductor device.

FIG. 25 is a plan view of a semiconductor device according to a fourth embodiment of the present invention, in which a plurality of different functional blocks are formed on one semiconductor chip for increasing the integration degree and the operational speed. In particular, the semiconductor device in which a DRAM and a control circuit such as a micro-professor are formed is called an embedded DRAM.

The operation of each functional block will be described below.

Data externally inputted via an input/output (I/O) portion is controlled by a micro-professor portion, and is subjected to high speed processing at a DSP (Digital Signal Processing) portion, or stored or read in or from a DRAM portion. At this time, a first cache array portion acts to transfer the digital data read out of the DRAM portion to the micro-professor portion in a synchronous operation and also transfer the data processed by the micro-professor portion to the DRAM portion in a synchronous operation. A second cache array portion acts as an intermediary of data between the DSP portion, first cache array portion, micro-professor portion, and input/output portion in synchronization with each block.

The portion in which potentials of channel formation regions are required to be commonly fixed at each functional block includes a transistor described in the first, second and third embodiment depending on the function and the corresponding impurity layer. The structure of the source/drain regions, the conduction type of the impurity layer, and the applied voltage are not required to be the same as those described in the first, second, and third embodiments.

While one example of the combination of the functional blocks is illustrated in this embodiment, the present invention is not limited thereto. Further, only one of the above-described functional blocks or part of the functional block may include a transistor described in the first, second, and third embodiments and the corresponding impurity layer, or each of the functional blocks may include a transistor described in the first, second, and third embodiments and the corresponding impurity layer.

According to the semiconductor device of the fourth embodiment, a plurality of the blocks are formed in a single device. At a portion of the functional block in which potentials of the channel formation regions are required to be commonly fixed, first and second active elements isolated by the partial STI can be formed depending on the necessary function, and the conduction type of the impurity layer and the applied voltage can be determined depending on the necessary function. Accordingly, it is possible to obtain a semiconductor device having a micro-structure, capable of suppressing a leakage current and improving the isolation breakdown voltage.

The present invention having the above-described configuration exhibits the following effects:

In the case of a semiconductor device having the SOI structure includes a partial STI structure, since an impurity layer is formed on the surface of a semiconductor substrate, even if a differential potential occurs between transistors adjacent to each other via the isolation insulating film, it is possible to suppress occurrence of a leakage current therebetween, and to enhance the breakdown voltage. As a result, it is possible to realize a semiconductor device having a micro-structure, capable of improving the isolation characteristic in spite of the micro-structure.

In the case of a semiconductor device in which MOS transistors adjacent to each other via an isolation insulating film having the partial STI structure have the same conduction type and the source/drain regions of the transistors are formed in such a manner as to reach a buried oxide film, since the potential of a channel stopper layer under the isolation insulating film is fixed and also an impurity layer on the surface of a semiconductor substrate has the conduction type reversed to that of the transistors and the potential of the impurity layer is fixed, even if a differential potential occurs between transistors adjacent to each other via the isolation insulating film, it is possible to suppress occurrence of a leakage current therebetween, and to enhance the breakdown voltage. As a result, it is possible to realize a semiconductor device having a micro-structure, capable of improving the isolation characteristic in spite of the micro-structure.

In the case of a semiconductor device in which MOS transistors have the same conduction type and source/drain regions thereof adjacent to each other via an isolation insulating film having the partial STI structure are formed in such a manner as to reach a buried oxide film, since the potential of a channel stopper layer under the isolation insulating film is not fixed for floating channel formation regions of the adjacent transistors so as to share them with each other, it is possible to accurately set the threshold voltages thereof, and further, since an impurity layer having the conduction type reversed to that of the transistors is formed on the surface of the semiconductor substrate at a position under the isolation insulating film and the potential of the impurity layer is fixed, even if a differential potential occurs between the transistors adjacent to each other via the isolation insulating film, it is possible to suppress occurrence of a leakage current generated therebetween and also to enhance the breakdown voltage. As a result, it is possible to realize a semiconductor device having a micro-structure, capable of improving the isolation characteristic in spite of the micro-structure.

In the case of a semiconductor device in which MOS transistors adjacent to each other via an isolation insulating film have the same conduction type and source/drain regions thereof are formed in such a manner as not to reach a buried oxide film, since an impurity layer having the same conduction type as that of the source/drain regions of the transistors is formed on the surface of a semiconductor substrate and a voltage as a reverse bias to the semiconductor substrate is applied to the impurity layer, even if a differential potential occurs between the source/drain regions of the transistors adjacent to each other via the isolation insulating film, it is possible to suppress occurrence of a leakage current generated therebetween and also to enhance the breakdown voltage. As a result, it is possible to realize a semiconductor device having a micro-structure, capable of improving the isolation characteristic in spite of the micro-structure.

In the case of a semiconductor device having the SOI structure in which impurity regions of transistors formed via an isolation insulating film having the partial STI structure have the reversed conduction types, since an impurity layer having the conduction type reversed to that of a semiconductor substrate is formed on the surface of the semiconductor substrate underneath a buried oxide film, and p-type and n-type channel stopper layers are formed under the isolation insulating film in such a manner that the conduction types of the impurity regions of the transistors have the pnpn relationship with those of the channel stopper layers and the potentials of the channel stopper layers are fixed, even if a differential potential occurs between the impurity regions, having the reversed conduction types, of the transistors adjacent to each other via the isolation insulating film, it is possible to suppress occurrence of a leakage current generated therebetween and also to enhance the breakdown voltage. As a result, it is possible to realize a semiconductor device having a micro-structure, capable of improving the isolation characteristic in spite of the micro-structure.

In the case of a semiconductor device having the SOI structure in which diodes are formed via an isolation insulating film having the partial STI structure and impurity regions adjacent to each other via the isolation insulating film have the reversed conduction types, since an impurity layer having the conduction type reversed to that of a semiconductor substrate is formed on the surface of the semiconductor substrate via a buried oxide film, and p-type and n-type channel stopper layers are formed under the isolation insulating film in such a manner that the conduction types of the impurity regions of the diodes have the pnpn relationship with those of the channel stopper layers and the potentials of the channel stopper layers are fixed, even if a differential potential occurs between the impurity regions, having the reversed conduction types, of the diodes adjacent to each other via the isolation insulating film, it is possible to suppress occurrence of a leakage current generated therebetween and also to enhance the breakdown voltage. As a result, it is possible to realize a semiconductor device having a micro-structure, capable of improving the isolation characteristic in spite of the micro-structure.

According to a semiconductor device in which an impurity layer extends under active regions, even if an impurity implanted for forming source/drain regions passes through a buried oxide film, it is entrapped by the impurity layer formed on the surface of a semiconductor substrate. As a result, since the potential of the impurity layer is fixed, there is no fear of malfunction of the circuit, to improve the reliability of the semiconductor device.

In the case of a semiconductor device in which a plurality of functional blocks are formed, since transistors isolated from each other by the partial STI can be formed at a portion where the potentials of channel formation regions are required to be commonly fixed depending on the necessary function and the conduction type of an impurity layer and an voltage applied to the impurity layer can be determined depending on the necessary function, it is possible to realize the micro-structure of the semiconductor device, suppress the leakage current, and improve the isolation characteristic.

In the case of a semiconductor device having the SOI structure, since an impurity layer is formed on the surface of a semiconductor substrate and a wiring line for fixing the potential of the impurity layer is formed, even if a differential potential occurs between impurity regions formed on the surface of the buried oxide film via an isolation insulating film having the partial STI structure, it is possible to suppress occurrence of a leakage current therebetween, and to enhance the breakdown voltage. As a result, it is possible to realize a semiconductor device having a micro-structure, capable of improving the isolation characteristic in spite of the micro-structure.

Further since the impurity layer can be formed not only in the isolation region but also under the active regions, even if the impurity implanted for forming the impurity regions passes through the buried oxide film, it is entrapped by the impurity layer until reaching the semiconductor substrate. As a result, since the potential of the impurity layer is fixed, there is no fear of malfunction of the circuit, to improve the reliability of the semiconductor device.

According to the semiconductor device of the present invention, since an impurity is implanted in a portion, remaining under an isolation insulating film, of a semiconductor layer at a concentration higher than that in the semiconductor layer out of the isolation insulating film to form a channel formation region, it is possible to further improve the isolation characteristic.

According to a semiconductor device in which a pMOS transistor is adjacent to an nMOS transistor via an isolation insulating film having the STI structure, since source/drain regions thereof are arranged in such a manner that the conduction types of one of the source/drain regions have a pnpn relationship with those of channel stopper layers formed under the isolation insulating film and the potentials of the impurity layers and the p-type and n-type channel stopper layers are fixed, even if a differential potential occurs between the source/drain regions adjacent to each other via the isolation insulating film, it is possible to suppress occurrence of a leakage current therebetween, and to enhance the breakdown voltage. As a result, it is possible to realize a semiconductor device having a micro-structure, capable of improving the isolation characteristic in spite of the micro-structure.

In the case of a semiconductor device having the SOI structure, since an impurity layer is formed on the surface of a semiconductor substrate and a wiring line for fixing the potential of the impurity layer is formed, even: if a differential potential occurs between impurity regions of transistors formed on the surface of the buried oxide film via an isolation insulating film having the partial STI structure, it is possible to suppress occurrence of a leakage current therebetween, and to enhance the breakdown voltage. As a result, it is possible to realize a semiconductor device having a micro-structure, capable of improving the isolation characteristic in spite of the micro-structure.

According to the semiconductor device of the present invention, since an impurity is implanted in a portion, remaining under an isolation insulating film, of a semiconductor layer at a concentration higher than that in the semiconductor layer out of the isolation insulating film to form a channel formation region, it is possible to further improve the isolation characteristic.

Further, the present invention is not limited to these embodiments, but variations and modifications may be made without departing from the scope of the present invention. The entire disclosure of Japanese Patent Application No. Hei 11-285269 filed on Oct. 6, 1999 including specification, claims, drawings and summary are incorporated herein by reference in its entirety.

What is claimed is:

1. A semiconductor device including an SOI substrate composed of a semiconductor substrate, a buried oxide film, and a semiconductor layer, comprising:
    a first isolation insulating film formed in a manner as to surround first and second active regions arranged on a principal surface of said semiconductor layer and to be separated a specific distance from said buried oxide film;
    a second isolation insulating film formed in such a manner as to surround a third active region arranged on a principal surface of said semiconductor layer, to completely isolate the third active region from the first and second active regions, and to be formed in direct contact with said buried oxide film;
    a first active element formed in said first active region;
    a second active element formed in said second active region;
    an impurity layer formed between said buried oxide film and one principal plane of said semiconductor substrate; and
    a wiring line extending through said third active region and said buried oxide film to contact said impurity layer.

2. The semiconductor device according to claim 1, wherein each of said impurity layer and said semiconductor layer has a first conduction type;
    said first active element is a MOS transistor including first source and drain regions having a second conduction type which extend from a principal plane of said first active region to said buried oxide film;
    said second active element is a MOS transistor including second source and drain regions having the second conduction type which extend from a principal plane of said second active region to said buried oxide film; and
    potentials of said impurity layer and a portion, remaining under said first isolation insulating film, of said semiconductor layer are fixable.

3. The semiconductor device according to claim 1, wherein each of said impurity layer and said semiconductor layer has a first conduction type;
    said first active element is a MOS transistor including first source and drain regions having a second conduction type which extend from a principal plane of said first active region to said buried oxide film;
    said second active element is a MOS transistor including second source and drain regions having the second conduction type which extend from a principal plane of said second active region to said buried oxide film; and
    a potential of said impurity layer is fixable, and a potential of a portion, remaining under said first isolation insulating film, of said semiconductor layer is not fixed.

4. The semiconductor device according to claim 1, wherein said semiconductor layer has a first conduction type, and said impurity layer has a second conduction type;
    said first active element is a MOS transistor including first source and drain regions having a second conduction type which are formed between a principal plane of said first active region and said buried oxide film in such a manner as to be separated a specific distance from said buried oxide film;
    said second active element is a MOS transistor including second source and drain regions having a second conduction type which are formed between a principal plane of said second active region and said buried oxide film in such a manner as to be separated a specific distance from said buried oxide film;
    a voltage applied to said impurity layer is reverse-biased with respect to said semiconductor substrate.

5. The semiconductor device according to claim 1, further comprising
    a first impurity region having a first conduction type and a second impurity region having a second conduction type to which reverse-biased voltages are to be applied, said first and second impurity regions extending from the underside of said first isolation insulating film to said buried oxide film in such a manner as to be adjacent each other;
    wherein said first active element is a MOS transistor including first source and drain regions having the second conduction type which extend from a principal plane of said first active region to said buried oxide film, one of said first source and drain regions being adjacent to said first impurity region;
    said second active element is a MOS transistor including second source and drain regions having the second conduction type which extend from a principal plane of said second active region to said buried oxide film, one of said second source and drain regions being adjacent to said second impurity region; and
    a voltage applied to said impurity layer is reverse-biased with respect to said semiconductor substrate.

6. The semiconductor device according to claim 1, wherein said impurity layer extends under said active regions.

7. The semiconductor device according to claim 1, further comprising:
    a function block different from a function block in which said first active element and said second active element are formed.

8. A semiconductor device including an SOI substrate composed of a semiconductor substrate, a buried oxide film, and a semiconductor layer, comprising:
    an isolation insulating film formed in a manner as to surround first and second active regions arranged on a principal surface of said semiconductor layer and to be separated a specific distance from said buried oxide film;
    a first active element formed in said first active region;
    a second active element formed in said second active region;
    an impurity layer formed between said buried oxide film and one principal plane of said semiconductor substrate;

a first impurity region having a first conduction type and a second impurity region having a second conductive type to which reverse-biased voltages are to be applied, said first and second impurity regions extending fro m the underside of said isolation insulating film to said buried oxide film in such a manner as to be adjacent to each other;

wherein said first active element is a diode including a third impurity region having the second conduction type adjacent to said first impurity region and a fourth impurity region having the first conduction type adjacent to said third impurity region;

said second active element is a diode including a fifth impurity region having the first conduction type adjacent to said second impurity region and a sixth impurity region having the second conduction type adjacent to said fifth impurity region;

a voltage applied to said impurity layer is reverse-biased with respect to said semiconductor substrate; and a wiring line electrically connected to said impurity layer.

* * * * *